(12) United States Patent  (10) Patent No.: US 7,750,457 B2
Seko  (45) Date of Patent: Jul. 6, 2010

(54) SEMICONDUCTOR APPARATUS, MANUFACTURING METHOD THEREOF, SEMICONDUCTOR MODULE APPARATUS USING SEMICONDUCTOR APPARATUS, AND WIRE SUBSTRATE FOR SEMICONDUCTOR APPARATUS

(75) Inventor: Toshiharu Seko, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 139 days.

(21) Appl. No.: 12/068,498

(22) Filed: Feb. 7, 2008

(65) Prior Publication Data

US 2008/0251946 A1    Oct. 16, 2008

Related U.S. Application Data

(62) Division of application No. 11/091,918, filed on Mar. 29, 2005, now abandoned.

(30) Foreign Application Priority Data

Mar. 30, 2004  (JP) ............... 2004-099768

(51) Int. Cl.
 *H01L 23/48* (2006.01)
(52) U.S. Cl. ............... 257/688; 257/668; 257/E21.503; 257/E23.07; 257/E23.177
(58) Field of Classification Search .......... 257/668, 257/678, E21.503, E23.07, E23.177, 688
See application file for complete search history.

(56) References Cited

U.S. PATENT DOCUMENTS 5,729,315 A * 3/1998 Takahashi et al. ........... 349/149
5,767,009 A    6/1998 Yoshida et al.
5,821,625 A   10/1998 Yoshida et al.
6,189,208 B1   2/2001 Estes et al.
6,710,458 B2   3/2004 Seko
6,864,119 B2   3/2005 Seko
2002/0043704 A1  4/2002 Seko
2004/0061240 A1  4/2004 Seko
2004/0063332 A1  4/2004 Seko

FOREIGN PATENT DOCUMENTS

JP  60-262430    12/1985
JP  63-151033     6/1988
JP  2003-31623 A  1/2003
JP  2003-37137 A  2/2003

* cited by examiner

*Primary Examiner*—Wael Fahmy
*Assistant Examiner*—John C Ingham
(74) *Attorney, Agent, or Firm*—Harness, Dickey & Pierce, P.L.C.

(57) ABSTRACT

A semiconductor apparatus of the present invention includes: (i) a wire substrate having an insulating substrate in which a plurality of wire patterns are provided, (ii) a semiconductor element installed on the wire substrate with the insulating resin interposed therebetween, and a plurality of connecting terminals provided in the semiconductor element are electrically connected to connecting terminals of the wire patterns, respectively. In the semiconductor apparatus, the insulating substrate has mark patterns for alignment of the connecting terminals of the semiconductor element and the connecting terminals of the wire patterns, and an entire upper face of each of the mark patterns is covered with the insulating resin.

17 Claims, 12 Drawing Sheets

SEMICONDUCTOR APPARATUS, MANUFACTURING METHOD THEREOF, SEMICONDUCTOR MODULE APPARATUS USING SEMICONDUCTOR APPARATUS, AND WIRE SUBSTRATE FOR SEMICONDUCTOR APPARATUS

This application is a divisional of application Ser. No. 11/091,918 filed on Mar. 29, 2005, now abandoned and from which priority is claimed under 35 U.S.C. §121. This application also claims priority from Japanese Patent Application No. 2004-099768 filed on Mar. 30, 2004 in the Japanese Patent Office under 35 U.S.C. §119. The entire contents of both of these applications are incorporated herein by reference.

FIELD OF THE INVENTION

The present invention relates to (i) a semiconductor apparatus having a flexible wire substrate on which a semiconductor element is bonded and mounted in accordance with the COF (Chip On Film) method; (ii) a manufacturing method thereof, (iii) a semiconductor module apparatus using the semiconductor apparatus, and (iv) a wire substrate used for the semiconductor apparatus.

BACKGROUND OF THE INVENTION

A TCP type semiconductor apparatus (hereinafter, referred to as "TCP") and a COF type semiconductor apparatus (hereinafter, referred to as "COF") have been widely known as a semiconductor apparatus obtained by bonding and mounting a semiconductor element on an insulating flexible wire substrate. The TCP is obtained by installing (mounting), by using the TCP (Tape Carrier Package) method, a semiconductor element on an insulating tape that is a base material of the flexible wire substrate. The COF is obtained by installing (mounting), by using the COF (Chip On Film) method, a semiconductor element on such an insulating tape.

Difference between the TCP and the COF is as follows. The TCP has an aperture portion (through hole) that is termed a "device hole" and that is provided beforehand in the aforementioned semiconductor element installation portion of the insulating tape, and the semiconductor element is bonded with front ends of wire patterns protruding, in a cantilever manner, in the aperture portion. On the other hand, the COF does not have such an aperture portion (device hole) for mounting a semiconductor element, and the semiconductor element is bonded and mounted on a surface of the insulating tape.

To accommodate to an intended use of the COF, the insulating tape used in the COF is a freely foldable thin film insulating tape. Provided on the surface of the insulating tape are wires of wire patterns, and the wires are electrically connected to relevant terminals of the semiconductor element. The insulating tape (the flexible wire substrate) has an external conductive connector portion that is connected to external electronic devices such as a liquid crystal panel and a print substrate. Note that, for securing insulation, a solder resist is applied to a pattern exposed portion excluding (i) the connection region where the wire patterns are connected with the semiconductor element, and (ii) the external conductive connector portion.

Presently required is realization of such a COF that deals with a larger number of pins, and that is smaller and thinner in shape. In order to satisfy such demands at the same time, the external conductive connector portion, and the connection portion connecting to the semiconductor element are each required to have fine pitches, and the tape carrier (insulating tape), the wire pattern, and the like are each required to be thinner. Further, for reduction of the pitch of the inner leads (the connection portion to the semiconductor element) of the wire patterns, each inner lead is required to be narrower and thinner.

There is an effective method for manufacturing a COF that deals with a larger number of pins and that allows acquirements of such a fine pitch, a narrow pitch, an edge touch, and the like. Examples of such a method include: (i) a connecting-sealing method termed the MMB (Micro Bump Bonding); and (ii) a connecting-sealing method (hereinafter, referred to as NCP etc.) termed the NCP (Non Conductive Paste) or APC (Anisotropic Conductive Paste), each of which has drawn attention recently. (For example, see Japanese Laid-Open Patent Publication Tokukaisho 60-262430/1985 (published on Dec. 25, 1985; corresponding to Japanese Examined Patent Publication Tokukouhei 2-7180 published on Feb. 15, 1990; hereinafter, referred to as "Patent document 1") and Japanese Laid-Open Patent Publication Tokukaisho 63-151033/1988 (published on Jun. 23, 1988; corresponding to Japanese Examined Patent Publication Tokukouhei 7-77227 published on Aug. 16, 1995; hereinafter, referred to as "Patent document 2")).

Each of the connecting-sealing methods such as the NCP etc., is a method for connecting protruding electrodes (connecting terminals) of a semiconductor element to respective wire patterns (connecting terminals) of a flexible wire substrate, and for sealing the protruding electrode and the wire pattern with a photo-curable or thermo-curable resin, each of which serves as an insulating resin and is provided beforehand between the semiconductor element and the flexible wire substrate by applying the insulating resin to a surface of an insulating tape.

For example, Patent document 1 shows an example using the MBB as follows. That is, a photo-curable or thermo-curable resin is applied to those wire patterns of the wire substrate which correspond to the protruding electrodes of the semiconductor element, respectively. The protruding electrodes and the wire patterns are aligned with each other, and the insulating resin between the protruding electrodes and the wire patterns is pushed out by applied pressure, so that electric conduction between the protruding electrode and the wire pattern is attained only by way of the pressure. The insulating resin thus pushed out extends to a periphery of the semiconductor element, and thereafter is cured by light or heat so as to fix the semiconductor element to the wire substrate and electrically connect the semiconductor element to the wire substrate.

Meanwhile, Patent document 2 shows another example using the MBB as follows. That is, a thermo-curable resin is applied to those wire patterns of the wire substrate which correspond to the respective protruding electrodes of the semiconductor elements. The semiconductor element is combined, by applying pressure to the semiconductor element with the use of a pulse heating tool, with the wire substrate such that the protruding electrodes are aligned with the wire patterns. The thermo-curable resin on the wire patterns is pushed out by the applied pressure. Thereafter, under application of pressure, an electric current is applied to the pulse heating tool so that the thermo-curable resin is heated and cured. This fixes the semiconductor element on the wire substrate, and electrically connects the protruding electrodes with the wire patterns.

However, neither Patent documents 1 nor 2 particularly discloses a method for applying the insulating resin, and a method for aligning the protruding electrode and the wire patterns.

However, in each of the above connecting-sealing methods such as the NCP etc., the semiconductor element is bonded by way of applying pressure after (i) the application of the insulating resin to the wire patterns of the insulating tape and (ii) the alignment of the protruding electrodes with the wire patterns. Therefore, for the alignment of the protruding electrodes and the wire patterns, an alignment mark pattern (hereinafter, referred to as "alignment mark") is required to be provided so as to prevent a positioning (alignment) error thereof and exposure of the wire patterns.

By the way, it is difficult to control a resin region with a conventional technique such as Au (gold)-Sn (tin) eutectic bonding, by which an insulating resin termed "under fill" is poured into a space between a semiconductor element and a wire substrate after connecting protruding electrodes and wire patterns. Specifically, when an alignment mark is provided within an aperture portion of a solder resist, the alignment mark is partially exposed, and is undistinguishable from exposure of the wire patterns. For this reason, the alignment mark is provided outside the aperture portion of the solder resist.

Therefore, for prevention of such exposure of the wire pattern also when using the connecting-sealing method such as the NCP etc., the alignment mark is required to be provided outside the application region of the insulating resin, in other words, outside of the aperture portion of the solder resist, the alignment mark being used for alignment upon connecting the protruding electrodes and the wire patterns.

In fact, an alignment mark partially covered with an insulating resin cannot be detected when the alignment mark is partially covered with an insulating resin, so that the alignment mark is provided, outside the aperture portion of the solder resist, away from the solder resist as distant as possible.

Here, the following explains a method for manufacturing a COF by using the connecting-sealing method such as the NCP etc., in other words, a method for installing a semiconductor element on a wire substrate, with reference to FIG. 13, FIG. 14, FIG. 15, and FIG. 16(a) through FIG. 16(e).

FIG. 13 is a plan view schematically illustrating a structure of a semiconductor apparatus in which alignment marks are provided outside an aperture portion of a solder resist. FIG. 14 is a plan view schematically illustrating a semiconductor element installation region in the semiconductor apparatus shown in FIG. 13. Note that, for ease of explanation, FIG. 14 indicates the semiconductor element by a chain double-dashed line, and indicates, by a broken line surrounding the chain double-dashed line, an installation site region (cover region) where the insulating resin is installed. In other words, the region surrounded by the chain double-dashed line in FIG. 14 indicates an overlap region overlapping with the semiconductor element. Whereas, the region surrounded by the broken line surrounding the region surrounded by the chain double-dashed line indicates the installation site region of the insulating resin, in other words, the installation region where the semiconductor element is installed by means of the insulating resin.

FIG. 15(a) through FIG. 15(e) and FIG. 16(a) through FIG. 16(e) are cross sectional views each illustrating a major part of the semiconductor apparatus taken along a line B-B' in FIG. 14. FIG. 15(a) through FIG. 15(e) illustrate steps of installing the semiconductor element on a wire substrate in Patent document 1, whereas FIG. 16(a) through FIG. 16(e) illustrate steps of installing the semiconductor element on a wire substrate in Patent document 2.

As shown in FIG. 13, FIG. 14, and FIG. 15(a), in cases where the semiconductor element is installed on the wire substrate in accordance with the method described in Patent document 1 by using the alignment marks, each of alignment marks 1 is provided, for alignment upon connecting protruding electrodes 13 of the semiconductor element 12 with connecting terminals 2a of wire patterns 2, outside an aperture portion 4a of the solder resist 3. The aperture portion 4a is so formed as to surround the connection-overlap portion of the semiconductor element 12 in a tape carrier 10 (insulating tape) used in a wire substrate 201.

Note that the semiconductor apparatus shown in FIG. 13, FIG. 14, and FIG. 15(a) through FIG. 15(e) has aperture portions 4b, which are parts of an aperture portion 4' of the solder resist 3 and which are provided in respective installation portions of the alignment marks 1.

As shown in FIG. 14 and FIG. 15(b), a photo-curable or thermo-curable insulating resin 11 is so applied as to cover each connecting terminal 2a. Next, alignment of protruding electrodes 13 with the connecting terminals 2a is carried out after carrying out (i) detection of each alignment mark 1 as indicated by arrows 14 in FIG. 15(c), and (ii) detection of each of alignment marks 5 (see FIG. 14), provided on an active face of the semiconductor element 12, as indicated by arrows 15. Thereafter, pressure is applied as indicated by arrows 17 in FIG. 15(d). This pushes out the insulating resin 11 provided between the protruding electrode 13 and the connecting terminal 2a, and the insulating resin 11 thus pushed out extends to a periphery of the semiconductor element 12, and is cured by light irradiation or heat application as indicated by arrows 18 in FIG. 15(e). With this, the semiconductor element 12 is fixed to the wire substrate 201.

Likewise, as shown in FIG. 13, FIG. 14, and FIG. 16(a), in cases where the semiconductor element is installed on the wire substrate in accordance with the method described in Patent document 2 by using the alignment marks, each of alignment marks 1 is provided, for alignment upon connecting a protruding electrode 13 of the semiconductor element 12 with connecting terminals 2a of wire patterns 2, outside an aperture portion 4a of the solder resist 3. The aperture portion 4a is so formed as to surround the connection-overlap portion of the semiconductor element 12 on a tape carrier 10 (insulating tape) used for a wire substrate 201.

Note that, also in this case, the semiconductor apparatus has aperture portions 4b, which are parts of an aperture portion 4' of the solder resist 3 and which are provided in respective installation portions of the alignment marks 1.

As shown in FIG. 14 and FIG. 16(b), a thermo-curable insulating resin 11 is so applied as to cover each connecting terminal 2a. Next, detection of each alignment mark 1 is carried out as indicated by arrows 14 in FIG. 16(c), and detection of the alignment mark 5 (see FIG. 14) provided on the active face of the semiconductor element is carried out as indicated by arrows 15. Then, pressure is applied to the semiconductor element 12 with the use of a pulse heating tool (not shown) in such a manner that, to cause the protruding electrodes 13 to be aligned with and in contact with the connecting terminals 2a, the insulating resin 11 on the connecting terminals 2a is pushed out, by the applied pressure, to a periphery of the insulating resin 11, as indicated by arrows 17 in FIG. 16(d). Thereafter, under application of pressure as indicated by arrows 19 in FIG. 16(e), an electric current is applied to the pulse heating tool so as to heat and cure the insulating resin 11. This fixes the semiconductor element 12 to the wire substrate 201, and electrically connects each protruding electrode 13 and the connecting terminal 2a.

However, as described above, each wire pattern 2 is required to be provided away from such an alignment mark 1 provided outside the aperture portion 4a of the solder resist 3, i.e., outside the application region of the insulating resin 11 in Patent documents 1 and 2. This causes an increase in an outer size of a semiconductor apparatus obtained by employing the COF method.

Further, when the insulating resin 11 is applied beyond the aperture portion 4a for prevention of exposure of the wire pattern 2 within the aperture portion 4a, each alignment mark 1 is possibly covered partially with the insulating resin 11. Such an alignment mark 1 partially covered with the insulating resin 11 deteriorates detection accuracy of the alignment mark 1 to such a degree that the alignment mark 1 cannot be accurately detected. This deteriorates the connection position accuracy of the protruding electrodes 13 of the semiconductor element 12 and the connecting terminals 2a of the wire patterns 2.

What is required to prevent such a positioning (alignment) error between the protruding electrodes 13 and the connecting terminals 2a is that: (i) the insulating resin 11 is applied, away from the formation region (aperture portion 4b) of the alignment mark 1 as distant as possible, in order not to spread over the alignment mark 1 as shown in FIG. 14; or (ii) the alignment mark 1 is provided as distant as possible from the aperture portion 4a of the solder resist 3. However, when the alignment mark 1 is provided distantly away from the aperture portion 4a of the solder resist 3, the connection position accuracy is deteriorated and outer size of the semiconductor apparatus becomes large. Meanwhile, when the insulating resin 11 is applied so as not to spread over the alignment mark 1, the wire pattern 2 tends to be exposed within the aperture portion 4a as shown in FIG. 14.

SUMMARY OF THE INVENTION

An object of the present invention is to provide (i) a COF type semiconductor apparatus that has good connection position accuracy of connecting terminals of a semiconductor element and connecting terminals of a wire pattern in a wire substrate, and that has a small outer shape; (ii) a method for manufacturing the semiconductor apparatus; (iii) a semiconductor module apparatus; and (iv) a wire substrate suitably used for the semiconductor apparatus.

Another object of the present invention is to provide (i) a COF type semiconductor apparatus that has good connection position accuracy of connecting terminals of a semiconductor element and connecting terminals of a wire pattern on a wire substrate, and that has a small outer shape, and that can prevent exposure of the wire pattern in the solder resist; (ii) a method for manufacturing the semiconductor apparatus; (iii) a semiconductor module apparatus; and (iv) a wire substrate suitably used for the semiconductor apparatus.

To achieve the object, a semiconductor apparatus according to the present invention includes: (i) a wire substrate including an insulating substrate on which a plurality of wire patterns are provided; and (ii) a semiconductor element installed on the wire substrate with an insulating resin interposed therebetween, a plurality of connecting terminals provided in the semiconductor element being electrically connected to connecting terminals of the wire patterns, respectively, wherein: the insulating substrate has mark patterns for alignment of the connecting terminals of the semiconductor element and the connecting terminals of the wire patterns, and an entire upper face of each of the mark patterns is covered with the insulating resin.

With the structure of the semiconductor apparatus, the mark pattern has the entire upper face which is covered with the insulating resin, and is provided in the insulating substrate of the semiconductor apparatus for the sake of alignment of the connecting terminals of the semiconductor element with the connecting terminals of the wire patterns. This allows prevention of hindrance of detection of the mark pattern, and good connection position accuracy of the connecting terminals of the semiconductor element and the connecting terminals of the wire pattern. Further, with the structure, the mark patterns are not required to be formed, e.g., outside the solder resist aperture portion that exposes the connecting terminals of the wire patterns, away from the solder resist as distant as possible for fear of the hindrance of the detection of the mark pattern. Therefore, with the structure, the mark patterns can be provided within or in the vicinity of the semiconductor element installation region, overlapping with the insulating resin, in the insulating substrate. This reduces outer size of the semiconductor apparatus, and improves freedom in wiring because the wire patterns are not required to be provided away from the mark pattern.

As such, according to the structure, it is possible to provide a COF type semiconductor apparatus having a small outer size and allowing good connection position accuracy between the connecting terminals of the semiconductor element and the connecting terminals of the wire patterns of the wire substrate.

To achieve the object, a semiconductor module apparatus according to the present invention includes the semiconductor apparatus according to the present invention.

With the structure of the semiconductor module including the semiconductor apparatus according to the present invention, it is possible to provide a semiconductor module apparatus using a COF semiconductor apparatus that allows good connection position accuracy between the connecting terminals of the semiconductor element and the connecting terminals of the wire pattern, and that has a small outer size, and that can prevent exposure of the wire patterns in the solder resist.

The semiconductor apparatus according to the present invention is suitably used for a driving apparatus for various kinds of semiconductor module apparatus, such as a mobile phone, a mobile information terminal, a thin display, and a laptop computer.

To achieve the object, a method, according to the present invention, for manufacturing the semiconductor apparatus according to the present invention includes the steps of: (i) providing the insulating resin on the insulating substrate such that the insulating resin covers an entire surface of each of the mark patterns; and (ii) detecting the mark patterns via the insulating resin provided on the mark patterns, and aligning the connecting terminals of the semiconductor element with the connecting terminals of the wire patterns.

With the method, the insulating resin is so provided as to cover the entire upper face of each mark pattern, and detection of the mark patterns is carried out via the insulating resin thus provided. This allows prevention of hindrance of detection of the mark pattern, and alignment, with good connection position accuracy, of the connecting terminals of the semiconductor element and the connecting terminal of the wire pattern. Further, with the method, the mark pattern is not required to be formed, e.g., outside the solder resist aperture portion that exposes the connecting terminals of the wire patterns, away from the solder resist as distant as possible for fear of the hindrance of the detection of the mark pattern. Therefore, with the method, the mark pattern can be provided within or in the vicinity of the semiconductor element installation region, overlapping with the insulating resin, in the insulating substrate. This reduces outer size of the semiconductor apparatus, and improves freedom in wiring because the wire patterns are not required to be provided away from the mark pattern.

As such, according to the method, it is possible to provide a COF type semiconductor apparatus having a small outer size and having good connection position accuracy between the connecting terminals of the semiconductor element and the connecting terminals of the wire patterns of the wire substrate.

To achieve the object, a wire substrate, according to the present invention, for use in the semiconductor apparatus according to the present invention includes: the mark patterns, for use in alignment of (i) the connecting terminals of wire patterns with (ii) the connecting terminals of the semiconductor element to be installed in the insulating substrate, the mark patterns being provided within a solder resist aperture portion that exposes the connecting terminals of the wire patterns, the solder resist aperture portion being formed in a solder resist covering the wire patterns provided in the insulating substrate.

To achieve the object, another wire substrate, according to the present invention, for use in the semiconductor apparatus, according to the present invention, including a solder resist aperture portion having a shape, when viewed from above, defined by (i) line segments, each of which intersects with the wire patterns provided in a long length direction of the semiconductor element installed in the insulating substrate, and each of which extends along an installation site region of the wire patterns, (ii) line segments, each of which intersects with the wire patterns extending in a short length direction of the semiconductor element, and each of which extends along an installation site region of the wire patterns, and (iii) linkage attaining line segments, each of which connect adjacent line segments of the line segments such that the linkage attaining line segment extends in an inner side with respect to each intersection point of respective extended lines of the line segments; and the mark pattern is formed outside the solder resist aperture portion and opposes each of the linkage attaining line segments, and the wire substrate includes: the mark patterns for alignment of (i) the connecting terminals of the wire patterns and (ii) the connecting terminals of the semiconductor element to be installed in the insulating substrate, the mark pattern opposing the respective linkage attaining line segments.

For alignment of the connecting terminals of the semiconductor element installed on the insulating substrate and the connecting terminals of the wire patterns, the wire substrate has the mark patterns within the solder resist aperture portion, exposing the connecting terminals of the wire patterns, of the solder resist covering the wire patterns provided in the insulating substrate. Therefore, according to the present invention, it is possible to easily obtain a wire substrate that has the mark patterns in the semiconductor element installation region overlapping with the insulating resin, which mark patterns each have the upper face entirely covered with the insulating resin. The mark patterns are used when installing the semiconductor element in the insulating substrate.

Moreover, in the present invention, when viewed from above, the solder resist aperture portion has a shape defined by (i) the line segments, each of which intersects with the wire patterns provided in a long length direction of the semiconductor element, and each of which extends along a provided region of the wire patterns, (ii) the line segments, each of which intersects with the wire patterns extending in a short length direction of the semiconductor element, and each of which extends along a provided region of the wire patterns, and (iii) the linkage attaining line segments, each of which connect adjacent line segments of the line segments such that the linkage attaining line segment extends in an inner side with respect to each intersection point of respective extension lines of the line segments, and the mark patterns for alignment of the connecting terminals of the semiconductor element and the connecting terminals of the wire patterns are formed outside the solder resist aperture portion and oppose the respective linkage attaining line segments. Therefore, according to the present invention, it is possible to easily obtain a wire substrate that has the mark patterns in the semiconductor element installation region overlapping with the insulating resin, which mark patterns each have the upper face entirely covered with the insulating resin and are used when installing the semiconductor element on the insulating substrate.

Therefore, with the structures above, it is possible to provide a wire substrate suitably used for the COF type semiconductor apparatus that is according to the present invention, and that has a small outer size, and that has good connection position accuracy between the connecting terminals of the semiconductor element and the connecting terminals of the wire patterns of the wire substrate.

Additional objects, features, and strengths of the present invention will be made clear by the description below. Further, the advantages of the present invention will be evident from the following explanation in reference to the drawings.

DESCRIPTION OF THE EMBODIMENTS

Embodiment 1

One embodiment of the present invention will be described below with reference to FIG. 1 through FIG. 11 and FIG. 18(a) through FIG. 18(d).

Note that the present embodiment explains a liquid crystal module (liquid crystal display apparatus) as an example of a semiconductor module according to the present invention; however, the present invention is not limited to this.

Figure 1:
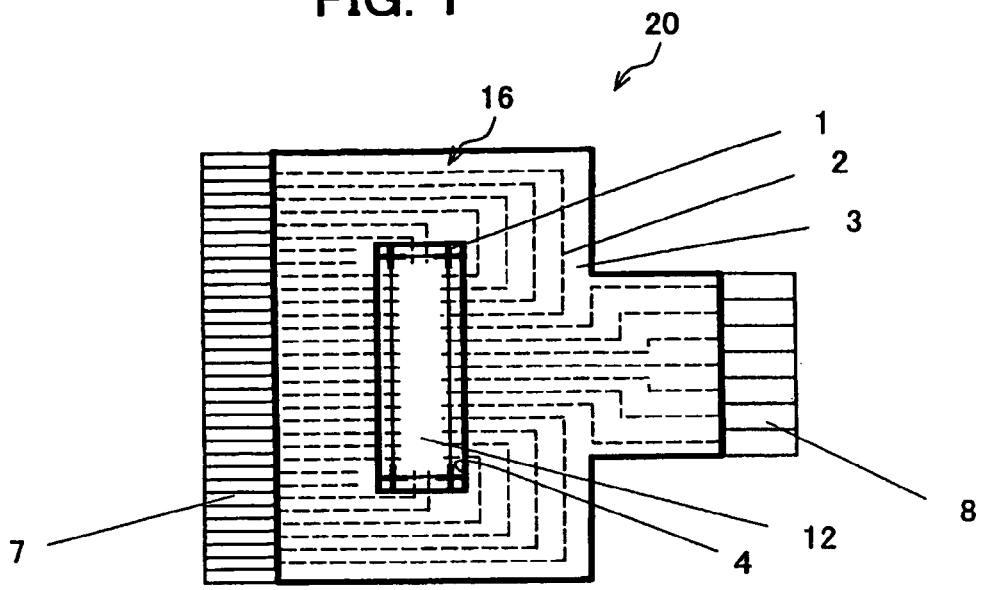
FIG. 1 is a plan view schematically illustrating a structure of a semiconductor apparatus according to an embodiment of the present invention.
Figure 2:
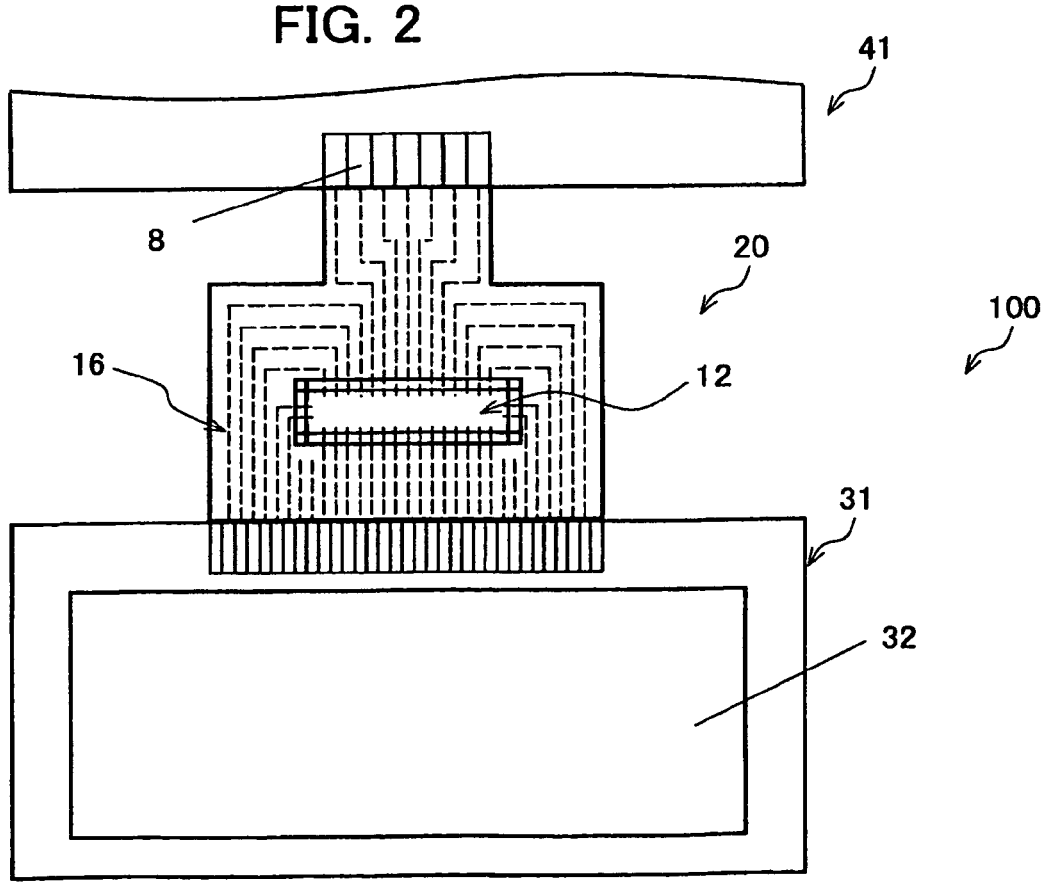
FIG. 2 is a plan view schematically illustrating a structure of a liquid crystal module in which the semiconductor apparatus shown in FIG. 1 is installed.
Figure 3:
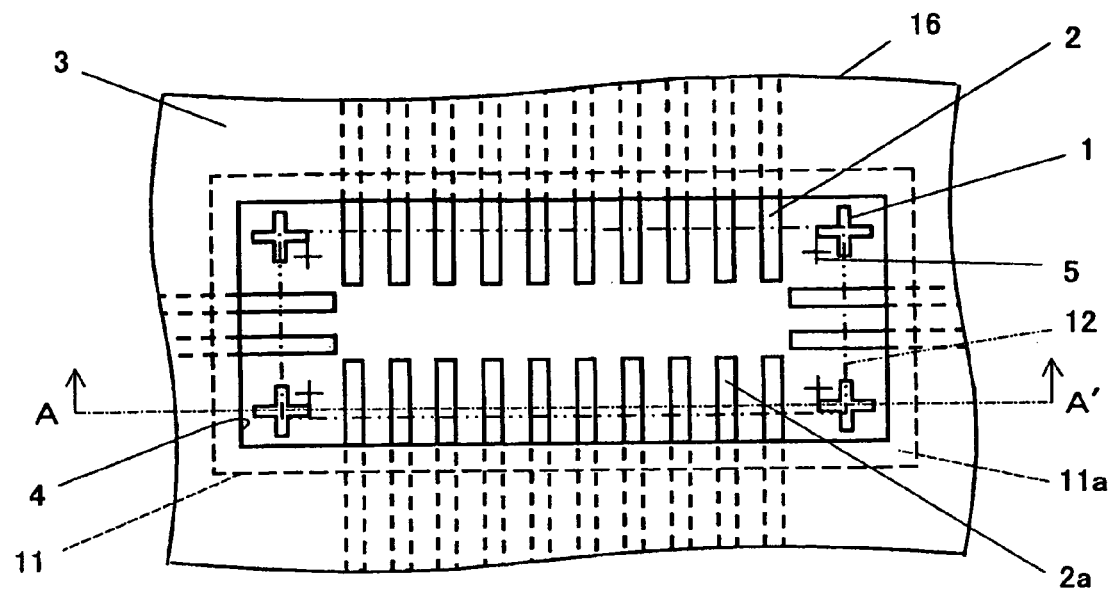
FIG. 3 is a plan view schematically illustrating a structure within a semiconductor element installation region in the semiconductor apparatus according to the embodiment of the present invention.
Figure 4:
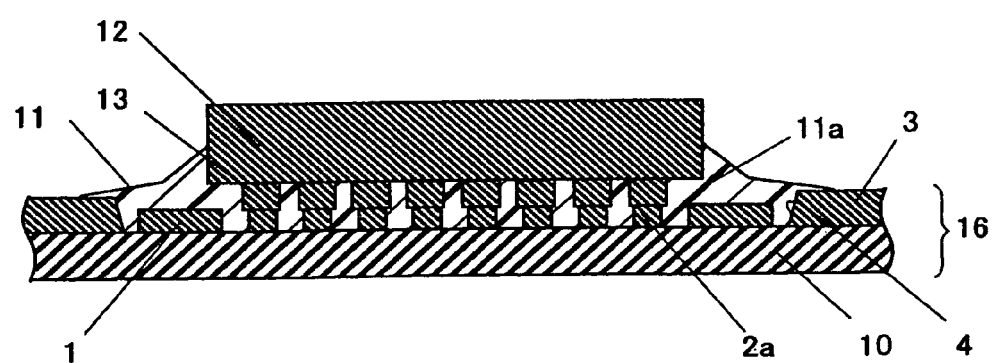
FIG. 4 is a cross sectional view schematically illustrating a major part of the structure of the semiconductor apparatus according to the embodiment of the present invention.
Figure 5:
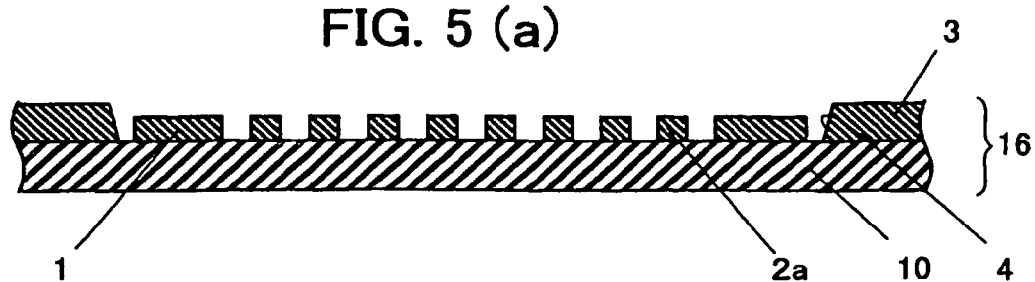
FIG. 5($a$) through FIG. 5($d$) are major part cross sectional views illustrating steps of manufacturing the semiconductor apparatus shown in FIG. 4, respectively.
Figure 5:
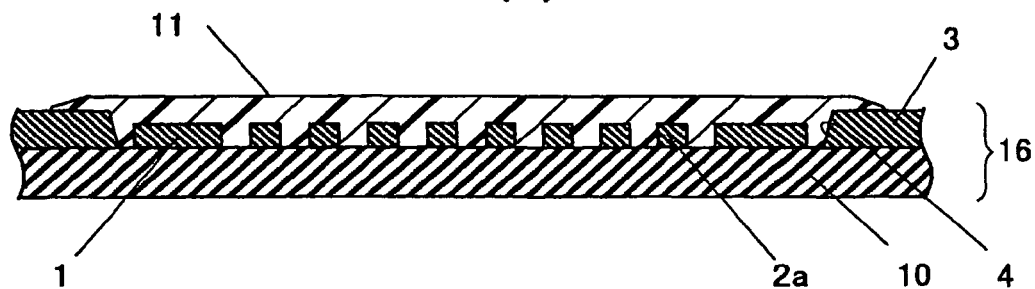
Figure 5:
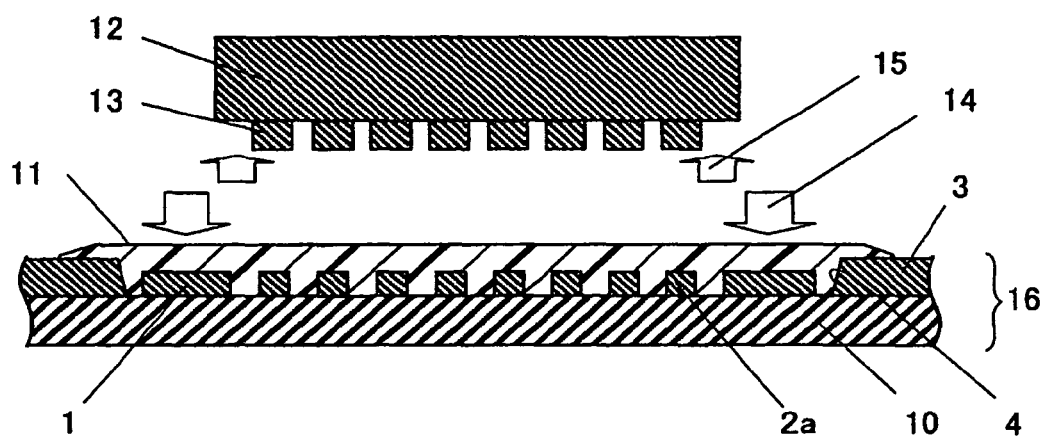
Figure 5:
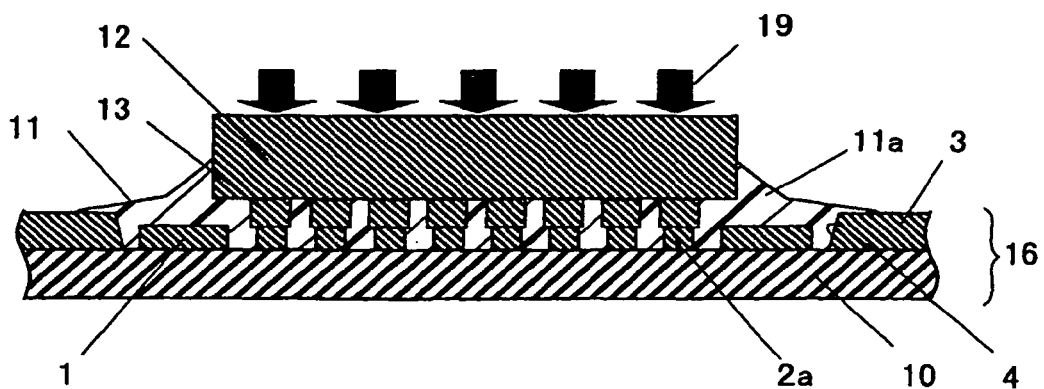

FIG. 1 is a plan view schematically illustrating a structure of a semiconductor apparatus according to the present embodiment. FIG. 2 is a plan view schematically illustrating a structure of a liquid crystal module in which the semiconductor apparatus shown in FIG. 1 is installed. FIG. 3 is a plan view schematically illustrating a semiconductor installation region in the semiconductor apparatus according to the present embodiment. FIG. 4 is a cross sectional view schematically illustrating a major portion of the structure of the semiconductor apparatus according to the present embodiment. Note that, for ease of explanation, in FIG. 3, the semiconductor element is indicated by a chain double-dashed line, and an installation site region (formation region) of an insulating resin is indicated by a broken line surrounding the chain double-dashed line. Namely, in FIG. 3, the region surrounded by the chain double-dashed line is an overlap region overlapping with the semiconductor element itself. The region surrounded by the broken line surrounding the chain double-dashed line is a region on which the insulating resin is provided, i.e., is an installation region in which the semiconductor is installed by using the insulating resin. A region sandwiched between the chain double-dashed line and the broken line corresponds to a fillet portion (fillet formation portion), which will be described later.

Hereinafter, the present invention assumes that the semiconductor installation region is made up of the semiconductor overlap region and the fillet formation region that is formed, by the insulating resin, on the periphery of the semiconductor overlap region.

Further, FIG. 4 is a cross sectional view of the semiconductor apparatus taken along a line A-A' of FIG. 3.

As shown in FIG. 2, a liquid crystal module 100 according to the present embodiment has such a structure that a semiconductor apparatus 20 according to the present embodiment is installed (provided) at an end of a shorter length direction of a liquid crystal panel 31. The semiconductor apparatus 20 according to the present embodiment includes a wire substrate 16 and a semiconductor element 12 as shown in FIG. 1 and FIG. 2.

The semiconductor apparatus 20 includes an output terminal 7 and an input terminal 8, each of which serves as an external conductive connector section. The output terminal 7 is provided on one end of the wire substrate 16, and is electrically connected to an external electronic device, i.e., to the liquid crystal panel 31 in the present embodiment. The input terminal 8 is provided on the other side of the wire substrate 16, and supplies a signal to the semiconductor apparatus 20. As shown in FIG. 2, the semiconductor apparatus 20 is electrically connected to the liquid crystal panel 31 via the output terminal 7.

The semiconductor apparatus 20 according to the present embodiment is a COF type semiconductor apparatus (COF), and is connected (bonded) to the liquid crystal panel 31 via, e.g., an ACF (anisotropic conductive film; not shown) or the like.

An output signal of the semiconductor apparatus 20 is sent from the output terminal 7 to each signal line of the liquid crystal panel 31 via an onboard wire (connecting wire; not shown) provided on a glass substrate 32 which is a component of the liquid crystal panel 31.

The semiconductor apparatus 20 is connected to a print substrate 41 (wire substrate) via the input terminal 8. Through this input terminal 8, a signal is exchanged and an electric power is distributed.

The semiconductor element 12 controls driving of the electronic device in which the semiconductor apparatus is provided. In other words, in the present embodiment, the semiconductor element 12 serves as a liquid crystal driver (liquid crystal driving circuit) used for controlling driving of the liquid crystal panel 31. The semiconductor element 12 is made of, e.g., a silicon wafer (silicon signal crystal substrate). On the semiconductor element 12, a plurality of protruding electrodes 13 (connecting terminals; bumps) made of a metal material (conductive material) are provided, with a bonding pad (not shown) therebetween. Each of the protruding electrodes 13 is used for input and output, and a suitable material thereof is, for example, gold (Au).

On the other hand, as shown in FIG. 3 and FIG. 4, the wire substrate 16 has such a structure that each of wire patterns 2 (wires) is provided on a tape carrier 10 (insulating tape; insulating substrate), which is a film substrate (base). According to the COF method by which no aperture portion (device hole) for mounting the semiconductor element 12 is formed in the tape carrier 10, the semiconductor sensor 12 is installed (mounted), with its active face downward (face down), in the wire substrate 16 such that the protruding electrodes 13 provided on the semiconductor element 12 are connected to the wire patterns 2.

The tape carrier 10 is a freely foldable and very flexible insulating film. For example, the tape carrier 10 is a flexible insulating film that mainly consists of an insulating material containing plastic such as a polyimide resin and a polyester resin. Note that the present embodiment uses a thin polyimide base insulating tape as the tape carrier 10; however, the present invention is not limited to this.

Moreover, the tape carrier 10 has such a thickness that allows the tape carrier 10 to be freely foldable, and the thickness is not particularly limited, but generally falls within a range from 15 μm to 40 μm. More specifically, the thickness of the tape carrier 10 is, e.g., 15 μm, 20 μm, 25 μm, 38 μm, or 40 μm.

Further, the wire patterns 2 are formed by, e.g., wet-etching a copper foil that is adhered (fixed) to the tape carrier 10 and that has a thickness of about 5 μm through 20 μm. More specifically, the wire patterns 2 (copper foil patterns) provided on a surface of the tape carrier 10 has a thickness of, e.g., 5 μm, 8 μm, 9 μm, 12 μm, or 18 μm. Moreover, the surfaces of the wire patterns 2 (copper foil patterns) are coated with tin, gold, or the like (not shown).

Further, a solder resist 3 (protecting film) made of an insulating resin film (insulating material) such as epoxy resin is applied to a pattern exposed portion, which is a region other than (i) the connection region (semiconductor element installation region) where the tape carrier 10 and the semiconductor element 12 are connected to each other, and (ii) the external conductive connector section (the output terminal 7 and the input terminal 8) connected to the liquid crystal panel 31, the print substrate 41 (see FIG. 2), and the like. The solder resist thus applied protects oxidation of the wire patterns 2, and secures insulation thereof.

The solder resist 3 has an aperture portion 4 (solder resist aperture portion) having a rectangular shape as shown in FIG. 3. The aperture portion 4 corresponds to the connection region of the wire patterns 2 with the semiconductor element 12, i.e., to the installation region (connection-overlap region) of the semiconductor element 12 on the wire substrate 16, more specifically, to the overlap region with the semiconductor element 12 on the wire substrate 16 and the peripheral region of the overlap region. In the present embodiment, alignment mark patterns (hereinafter, referred to as "alignment marks") 1 are provided at four ends (i.e., corners) inside the aperture portion 4 of the solder resist 3, respectively. Each of the alignment marks 1 is used for alignment upon connecting the protruding electrode 13 of the semiconductor element 12 to the wire patterns 2. The alignment mark 1 has a substantially cross shape ("+" shape; hereinafter, referred to as simply "cross shape") having line segments parallel to edges (sides) of the aperture portion 4, respectively.

It is preferable that the alignment marks 1 and the wire patterns 2 be made of the same material. This allows simultaneous formations of the alignment marks 1 and the wire patterns 2.

In the present embodiment, the alignment marks 1 and the wire patterns 2 are made of the same material (copper foil), and have the same height. Moreover, each of the alignment marks 1 is provided in each corner in the aperture portion, distantly away from the wire pattern 2 so as not to make contact with each protruding electrode 13 of the semiconductor element 12.

In the present embodiment, the alignment is carried out in the following manner. That is, the semiconductor element 12 is positioned above the alignment mark 1 such that a junction of the cross shape of the alignment mark 1 corresponds to the corresponding corner of the semiconductor element 12.

With this, the semiconductor element 12 is installed within a region surrounded by the junctions of the alignment marks 1, which are respectively provided in the four corners (ends) of the aperture portion 4 formed in the wire substrate 16. The installation is carried out such that the protruding electrodes 13 of the semiconductor element 12 are connected to the respective connecting terminals 2a of the wire patterns 2, by using an insulating resin 11 for sealing the lower face of the semiconductor element 12. A specific example of the insulating resin 11 is an NCP.

In the present embodiment, as shown in FIG. 3 and FIG. 4, the insulating resin 11 is so provided (formed) as to cover each alignment mark 1 and extend outside the aperture portion 4 of the solder resist 3. The connection of the wire substrate 16 and the semiconductor element 12 is carried out under application of heat and pressure, so that the insulating resin 11 between the wire substrate 16 and the semiconductor element 12 becomes flowable, is pushed out of the space between the wire substrate 16 and the semiconductor element 12, extends outwardly with respect to the semiconductor element 12, and is cured. With this, a fillet portion (fin-shaped portion) 11a extending outwardly with respect to the semiconductor element 12 is formed on the periphery of the semiconductor element 12.

A publicly known insulating resin for connecting and sealing the semiconductor element 12 can be used as the insulating resin 11, and a material (composition) of the resin is not particularly limited. Examples of the insulating resin 11 include: translucent (preferably, transparent) thermo-curable resins or photo-curable resins such as a UV-curing resin. Specific examples of the insulating resin 11 include: an epoxy resin, a silicone resin, a phenoxy resin, an acrylic resin, a polyethersulfone resin (PES resin), and so on.

Next, the following description explains a method for manufacturing the semiconductor apparatus 20 according to the present embodiment, in other words, a way of installing the semiconductor element 12 on the wire substrate 16, with reference to FIG. 3, and FIG. 5(a) through FIG. 5(d).

FIG. 5(a) through FIG. 5(d) are cross sectional views each illustrating a major part of the semiconductor apparatus 12 according to the present embodiment, and illustrating steps of manufacturing the semiconductor apparatus 12.

In the present embodiment, as shown in FIG. 3 and FIG. 5(a), the alignment marks 1 are provided inside the aperture portion 4 of the solder resist 3, the aperture portion 4 being formed in (i) the connection-overlap region of the semiconductor element 12 on the tape carrier 10 of the wire substrate 16, and (ii) the peripheral region of the connection-overlap region (installation region). The purpose of providing the alignment marks 1 is for the alignment upon connecting the protruding electrodes 13 of the semiconductor element 12 and the connecting terminals 2a of the wire patterns 2.

The alignment marks 1 and the wire patterns 2 can be made of the same material, and be formed simultaneously by the same formation steps. The alignment marks 1 and the wire patterns 2 can be formed by, for example, etching the copper foil provided on the tape carrier 10.

The following explains the casting method as an example of the method for forming the alignment marks 1 and the wire patterns 2, in other words, the method for manufacturing the wire substrate 16 according to the present invention; however, the present invention is not limited to this. The alignment marks 1 and the wire patterns 2 can be formed by using a publicly known conventional wire pattern forming method.

Firstly in manufacturing the wire substrate 16 by using the casting method, a roughing treatment is carried out with respect to a surface of a copper foil, and a polyimide precursor solution is applied to the copper foil thus roughed up, and then imidization of the polyimide precursor solution is carried out. This allows manufacture of a copper-polyimide layered substrate, in other words, manufacture of a copper-clad base film by layering a copper foil, for use in the wire pattern formation, on a base film (tape carrier 10) made of polyimide. Next, a photo sensitive film which is made of an etching resistance material is adhered to the copper foil, and exposure and development are carried out with respect to a pattern formation region (of the wire patterns 2 and the alignment marks 1) so that the photo sensitive film having etching resistance is left only in the pattern formation region, and then an etching liquid is sprayed to the surface of the copper foil in order to etch and remove the copper foil provided in a region other than the pattern formation region. Thereafter, the photosensitive film on the layered substrate is removed by a chemical such as an organic solvent so that the pattern is exposed, with the result that the tape carrier 10 having the wire patterns 2 and the alignment marks 1 is formed on one surface. Thereafter, the solder resist 3 is applied to the pattern formation region excluding a region surrounded by the alignment marks 1 in the tape carrier 10. With this, the alignment marks 1 are exposed in the region. A portion, which is not covered with the solder resist-3, of the wire pattern 2 will be used as the connecting terminal 2a. Here, at least a surface of each connecting terminal 2a is coated with tin or gold. This allows acquirement of the wire substrate 16 that has the alignment marks 1 inside the aperture portion 4 of the solder resist 3 and that is according to the present embodiment.

In the present embodiment, the alignment marks 1 each having a cross shape when viewed from above are provided at the corners inside the aperture portion 4, distantly away from the wire patterns 2, respectively.

Next, as shown in FIG. 3 and FIG. 5(b), the thermo-curable insulating resin 11 is so applied as to cover the connecting terminals 2a. In the present embodiment, the insulating resin 11 is applied to inside and outside of the aperture portion 4, and is applied to the entire surface of each alignment mark 1 such that the alignment mark 1 is wholly covered.

A target location for application of the insulating resin 11 is determined by detecting the alignment marks 1.

The detection of the alignment marks 1 is carried out by, e.g., using a detecting mechanism (camera) of a commercially available flip chip bonder.

Next, while detecting the alignment mark 1 as indicated by arrows 14 in FIG. 5(c) and each alignment mark 5 (provided on the active face of the semiconductor element 12; see FIG. 3) as indicated by arrows 15, the alignment of the connecting terminals 2a and the protruding electrodes 13 of the semiconductor element 12 is carried out. The detection of the alignment marks 1 is carried out via the insulating resin 11 applied to the surface of the alignment mark 1.

The detections of the alignment marks 1 and 5 can be carried out by detecting (checking) the respective positions of the alignment marks 1 and 5 with the use of the detecting mechanism (camera) of the commercially available flip chip bonder as described above.

Note that, in the present embodiment, it is preferable that the insulating resin 11 be translucent so as to allow for accurate detection of the insulating resin 11, because the detection is carried out via the insulating resin 11 applied to the surface of the alignment mark 1. However, the insulating resin 11 is thinly layered (applied) on the alignment mark 1, so that the insulating resin 11 is not necessarily transparent. Therefore, the insulating 11 may be made of such a material that allows the detecting mechanism to detect the alignment mark 1, and may have such a film thickness that allows the detecting mechanism to detect the alignment mark 1.

In the present embodiment, the alignment of the connecting terminals 2a and the protruding electrodes 13 is carried out by positioning each corner of the semiconductor element 12 on the corresponding junction of the cross shape of the alignment marks 1 provided in each corner of the inside of aperture portion 4.

Thereafter, pressure and heat are applied to the semiconductor element 12 as indicated by arrows 19 in FIG. 5(d) with the use of a heating tool (not shown) such as a pulse heating tool so that: (i) the semiconductor element 12 is bonded to and mounted on the wire substrate 16 by way of the thermo-curing of the insulating resin 11, and (ii) the protruding electrodes 13 of the semiconductor element 12 and the connecting terminals 2a are relevantly bonded together so that the protruding electrodes 13 are electrically connected to the wires of the wire patterns 2, respectively.

The bonding of the protruding electrodes 13 and the connecting terminals 2a under application of pressure on the semiconductor element 12 causes the insulating resin 11 to be pushed out from the region below the semiconductor element 12 to surroundings of the semiconductor element 12. The insulating resin 11 thus pushed out and the insulating resin 11 applied to the surroundings of the semiconductor element 12 forms the fillet portion 11a (resin fillet) along sides of the semiconductor element 12.

With this, it is possible to obtain the semiconductor apparatus 20 in which the semiconductor element 12 is installed (mounted) by using the insulating resin 11 in accordance with the COF method, and which is according to the present embodiment.

In the above manufacturing method, a thermo-curable resin is used as the insulating resin 11, and the insulating resin 11 is cured by heating. However, a photo-curable resin may be used as the insulating resin 11, and the insulating resin 11 may be cured by light irradiation thereon. Note that, curing conditions of the insulating resin 11 are not particularly limited.

Examples of the method for applying the insulating resin 11 may include: a spraying by using a dispenser, an instilling by using a nozzle, a layering of sheet-shaped thermo-plasticizing resins or photo-curable resin, and the like. The method for applying the insulating resin 11 is not particularly limited, either.

The connecting-sealing methods such as the MBB, the NCP, and the ACP allow relatively easy control of the application region of the insulating resin 11. In this view, the alignment mark 1 is provided inside the aperture portion 4 of the solder resist 3, and is wholly covered with the insulating resin 11 in the present embodiment as described above.

According to the present embodiment, the wholly covered surface of the alignment mark 1 allows accurate detection of the alignment mark 1, as is the case where the entire surface of the alignment mark 1 is exposed.

Here, as a comparison, the following description explains installation of a semiconductor element 12 in a COF type semiconductor apparatus in cases where each of alignment marks 1 is partially covered with an insulating resin 11, with reference to FIG. 17, and FIG. 18(a) through FIG. 18(d). The manufacture of the semiconductor apparatus is carried out by using a connecting-sealing method such as the NCP etc.

FIG. 17 and FIG. 18(a) through FIG. 18(d) each illustrate the case where the insulating resin 11 partially covers each of the alignment marks 1, provided outside an aperture portion 4a of a solder resist 3 as shown in FIG. 13, FIG. 14, FIG. 15, and FIG. 16(a) through FIG. 16(c). The aperture portion 4a is formed within a connection-overlap region and its peripheral region (installation region) on a tape carrier 10 used in a wire substrate 201. The partial covering of the alignment mark 1 is an example of a problem occurring with ease when an application region of the insulating resin 11 is wide for prevention of exposure of the wire patterns 2 in the aperture portion 4a. In other words, FIG. 17 and FIG. 18(a) through FIG. 18(d) illustrate the case where the alignment mark 1 is not fully within the application region of the insulating resin 11.

Figure 17:
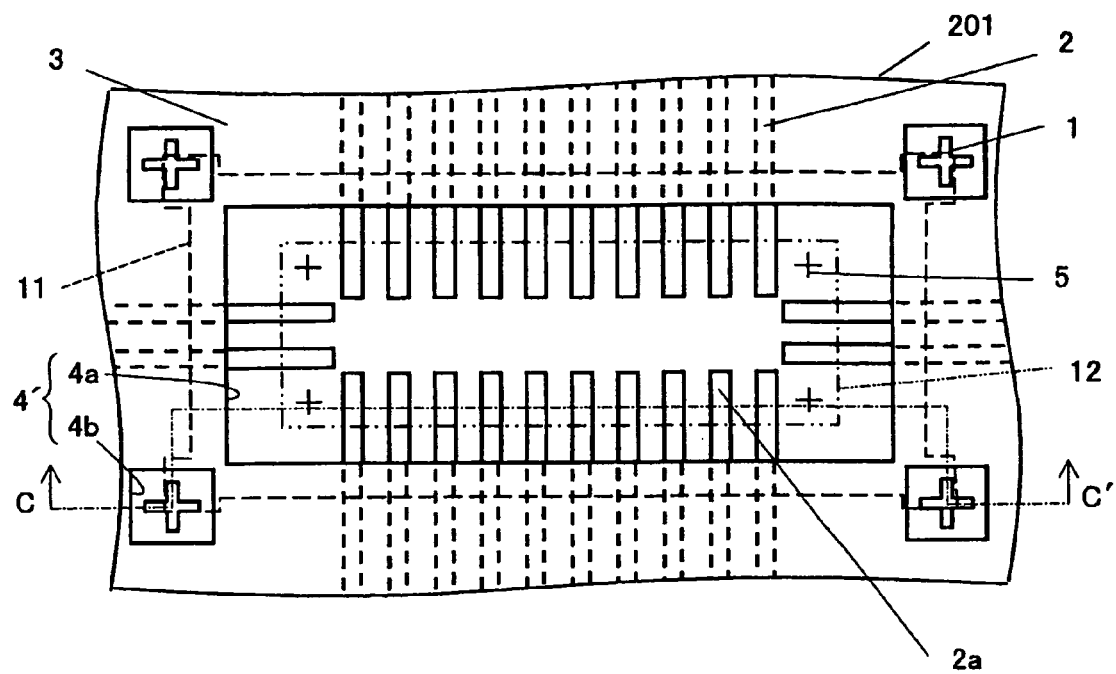
FIG. 17 is a plan view schematically illustrating a semiconductor element installation region in a comparative semiconductor apparatus.

FIG. 17 is a plan view schematically illustrating a semiconductor element installation region of the comparison semiconductor apparatus. FIG. 18(a) through FIG. 18(d) are cross sectional views illustrating a major part of the semiconductor apparatus, and illustrating steps of manufacturing the semiconductor apparatus shown in FIG. 17, respectively. Note that, also in FIG. 17, for ease of explanation, the semiconductor element is indicated by a chain double-dashed line, and an installation site region (formation region) of the insulating resin is indicated by a broken line surrounding the chain double-dashed line. Each of FIG. 18(a) through FIG. 18(d) corresponds to a cross sectional view taken along a line C-C' of the semiconductor apparatus shown in FIG. 17.

Figure 18:
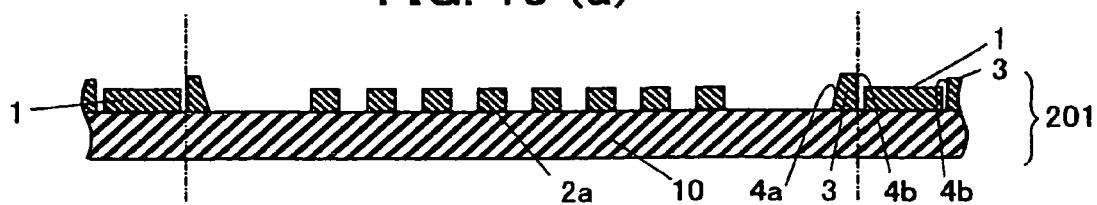
FIG. 18(a) through FIG. 18(d) are major part cross sectional views illustrating steps of manufacturing the semiconductor apparatus shown in FIG. 17.
Figure 18:
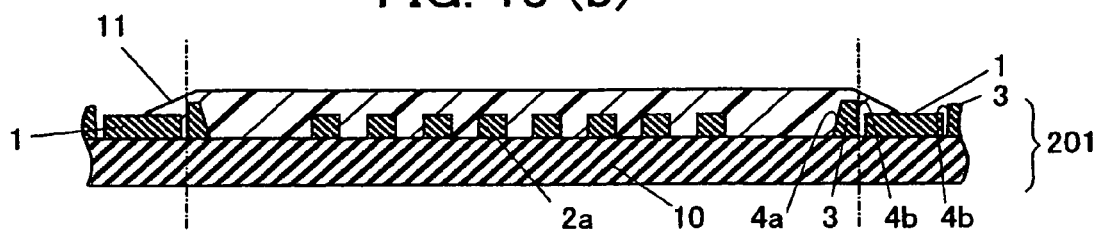
Figure 18:
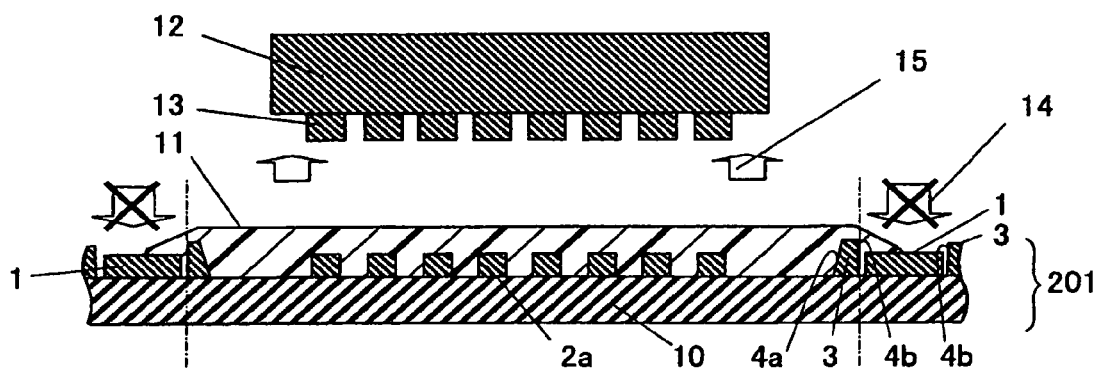
Figure 18:
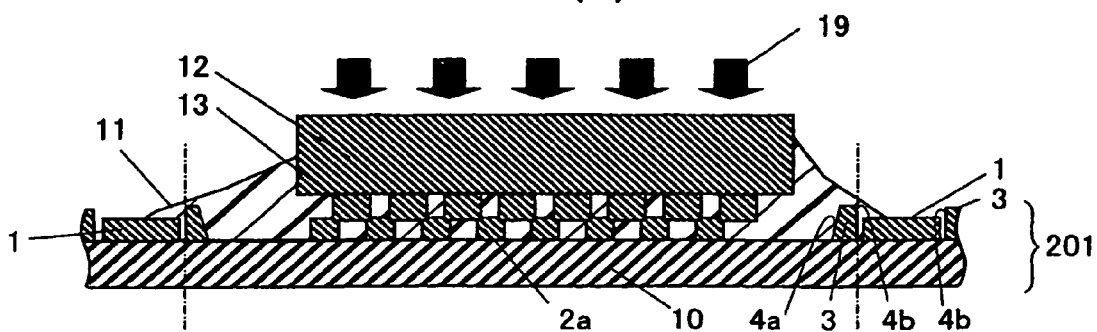

In the present comparative example, as shown in FIG. 17 and FIG. 18(a), the alignment marks 1 are respectively provided within aperture portions 4b formed outside the aperture portion 4a of the solder resist 3, the aperture portion 4a being provided within the connection-overlap region and its peripheral region (installation region). Thereafter, the thermo-curable insulating resin 11 is applied to inside and a periphery of the aperture portion 4a as shown in FIG. 18(b). In the present comparative example, because each aperture portion 4b is formed in the application region of the insulating resin 11, the insulating resin 11 partially covers the alignment mark 1.

The present inventors found that the irregularity in detection portion (such an alignment mark 1) hinders normal detection of the alignment mark 1, when the detection is carried out as indicated by arrows 14 in FIG. 18(c).

As shown in FIG. 18(d), this deteriorated connection position accuracy between the protruding electrodes 13 of the semiconductor element 12 and the connecting terminals 2a of the wire substrate 201, and no good connection therebetween accordingly was obtained.

As such, when the insulating resin 11 is applied beyond the aperture portion 4a of the solder resist 3 for sake of preventing the exposure of the wire patterns 2 in the aperture portion 4a, the insulating resin 11 partially covers the alignment mark 1. This deteriorates the detection accuracy of the alignment mark 1, and no accurate detection possibly can be carried out.

Such a tendency is noticeable when the alignment mark 1 is provided outside the aperture portion 4a, and when the application region of the insulating resin 11 is large to some extent or when the alignment mark 1 is provided close to the aperture portion 4a.

Figure 14:
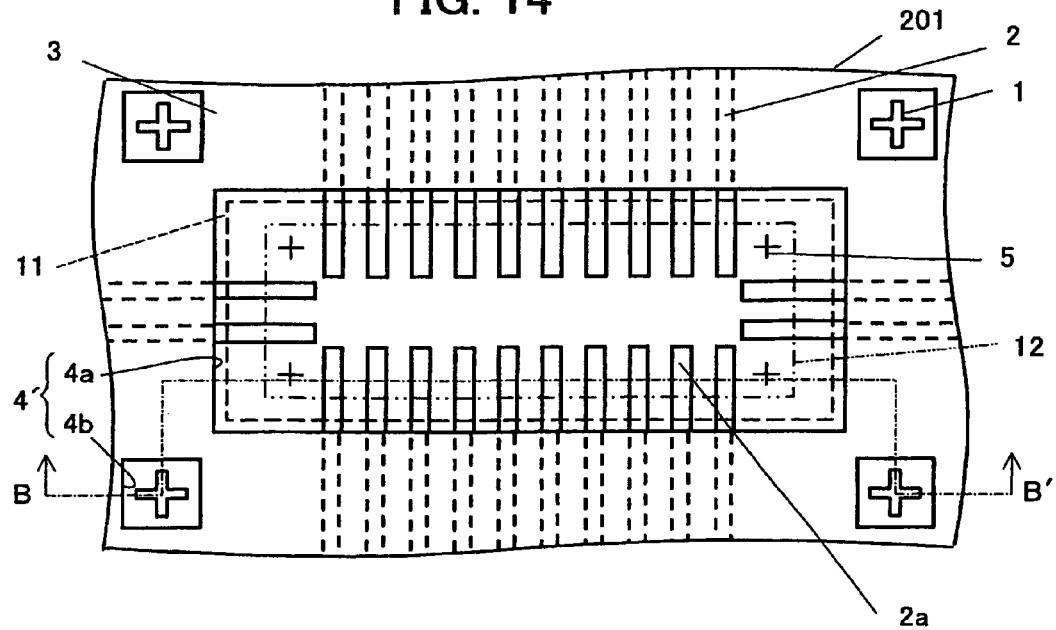
FIG. 14 is a plan view schematically illustrating a semiconductor element installation region in the semiconductor apparatus according to the embodiment of the present invention.
Figure 15:
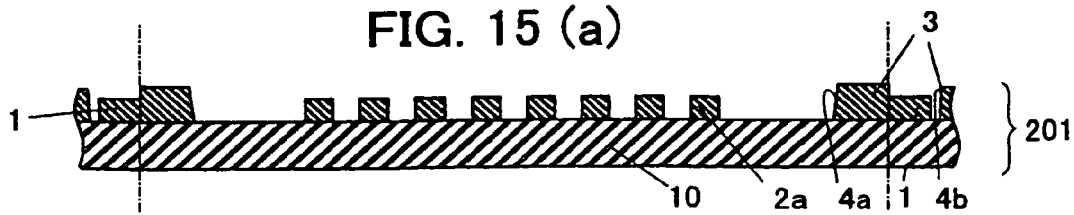
FIG. 15(a) through FIG. 15(e) illustrate steps of installing the semiconductor element on the wire substrate, assuming that an alignment mark is used in Patent document 1.
Figure 15:
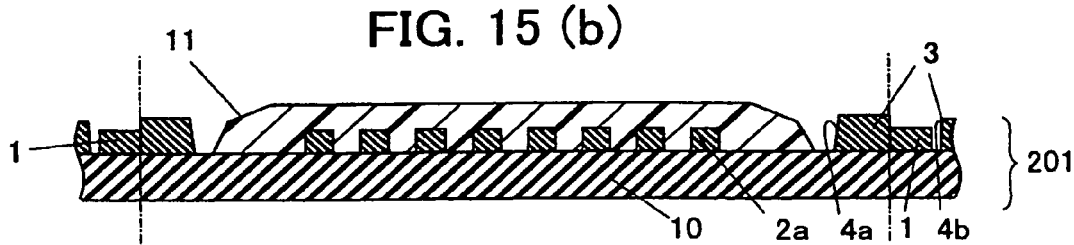
Figure 15:
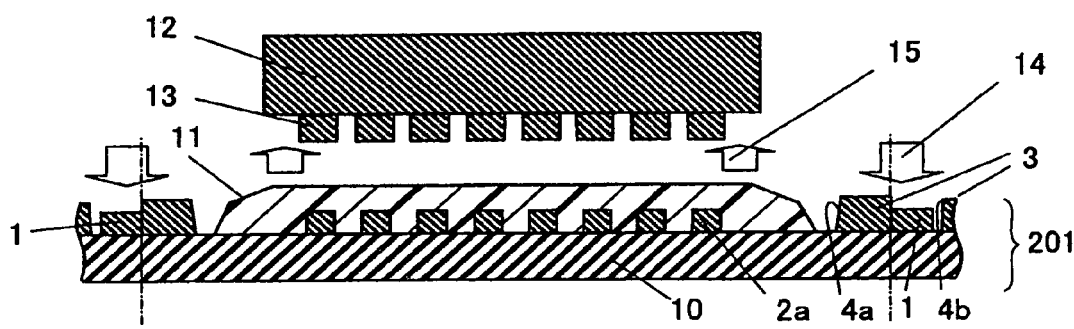
Figure 15:
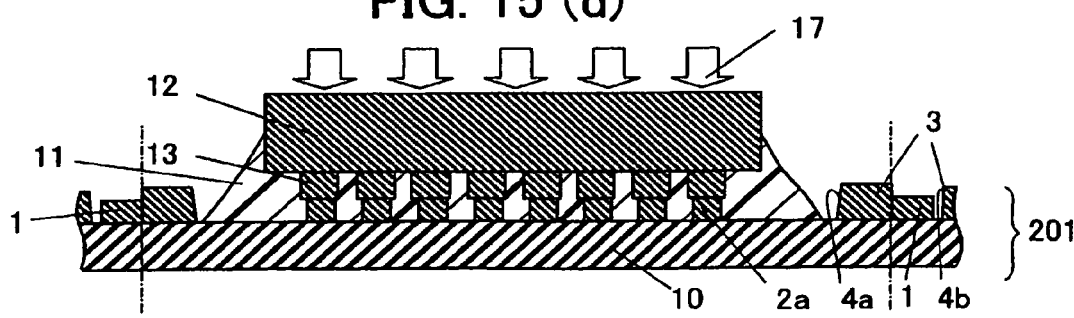
Figure 15:
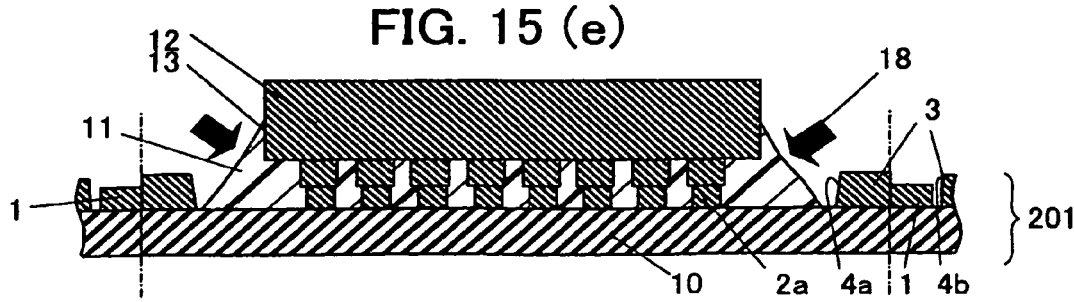
Figure 16:
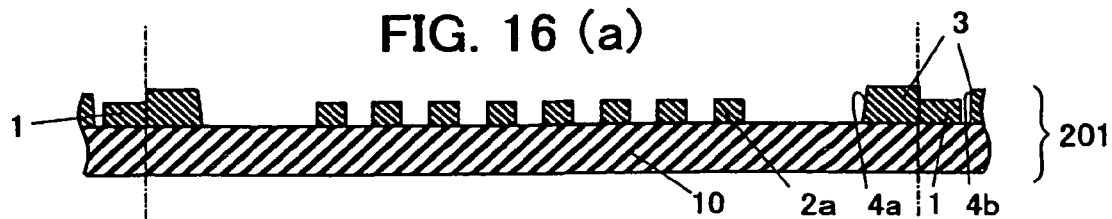
FIG. 16(a) through FIG. 16(e) respectively illustrate steps of installing the semiconductor element on the wire substrate, assuming that an alignment mark is used in Patent document 2.
Figure 16:
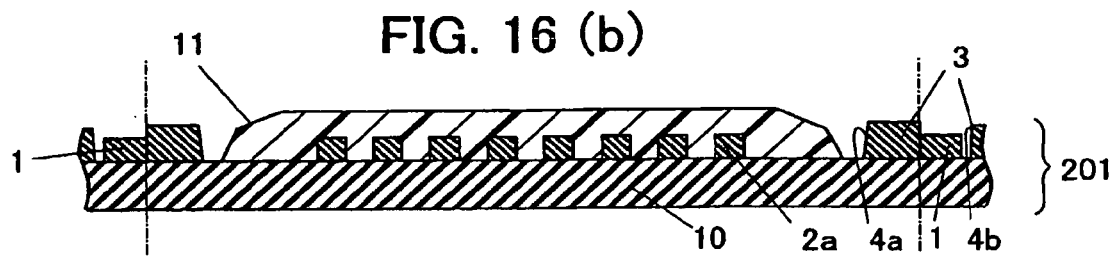
Figure 16:
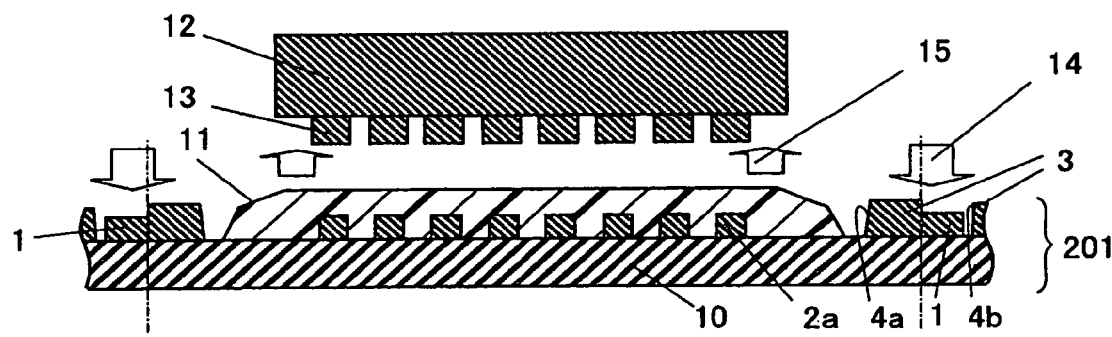
Figure 16:
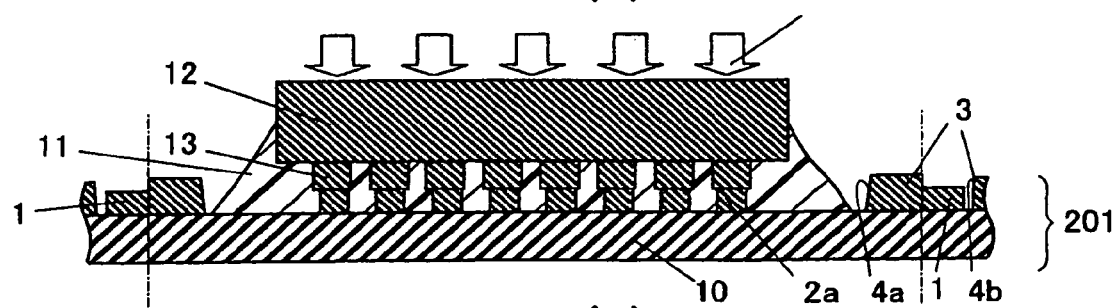
Figure 16:
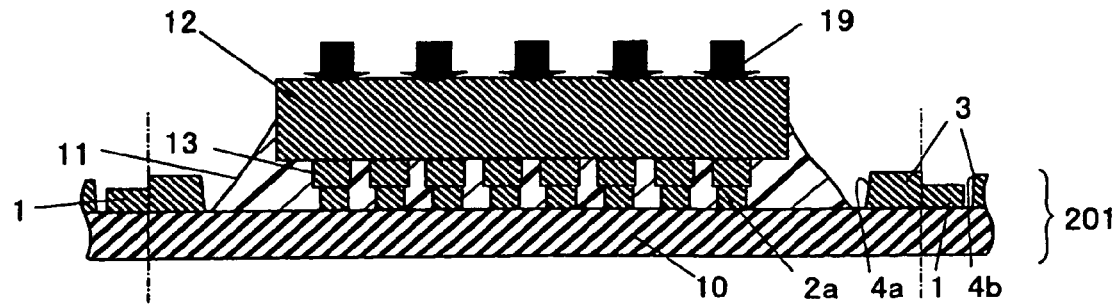

In order to prevent the alignment mark 1 from being partially covered with the insulating resin 11, for example, the application region of the insulating resin 11 is required to be smaller as shown in FIG. 14, or the alignment mark 1 is required to be provided greatly away from the application region of the insulating resin 11. However, as described above, these arise problems such as (i) exposure of the wire patterns 2 within the aperture portion 4a, and (ii) an increase in an outer size of the semiconductor apparatus to be manufactured.

However, the present inventors confirmed that: according to the present embodiment, the alignment mark 1 is free from the irregularity in the detection portion (alignment mark 1) when the entire surface of the alignment mark 1 is covered with the insulating resin 11 as described above, so that detection can be normally carried out.

Further, the present embodiment ensures prevention of the exposure of the wire patterns 2 in the aperture portion 4 by applying the insulating resin 11 to the aperture portion 4 of the solder resist 3 and beyond the aperture portion 4.

As described above, upon installing (mounting) the semiconductor element 12 on the flexible tape carrier 10 having a thin film shape, the insulating resin 11 is pushed out to the surroundings of the semiconductor element 12 and is cured there in order to reinforce and firmly bond the semiconductor element 12 and the tape carrier 10 in their connection region (semiconductor element installation region). As the result, the fillet portion 11a is formed in the surroundings of the semiconductor element 12.

In this way, the formation of the fillet portion 11a in the surroundings of the semiconductor element 12 is done by using the insulating resin 11 applied to the tape carrier 10. On this account, the insulating resin 11 is less likely to spread beyond the application region of the insulating resin 11. Rather, the region covered with the insulating resin 11 tends to be reduced. Moreover, the insulating resin 11 used for the formation of the fillet portion 11a leaves a thin resin, as remaining of the applied insulating resin 11, in the application region of the insulating resin 11. For this reason, it is preferable that the insulating resin 11 be applied to inside and outside of the aperture portion 4 of the solder resist 3, in order to surely prevent the exposure of the wire patterns 2 within the aperture portion 4.

As described above, in the present embodiment, the alignment mark 1 is provided in the aperture portion 4 of the solder resist 3, and the insulating resin 11 for connecting and sealing the semiconductor element 12 is so applied as to cover wholly the alignment mark 1, and the insulating resin 11 thus wholly covering the surface of the alignment mark 1 allows the detection of the alignment mark 1 without any hindrance. This allows good connection position accuracy between the protruding electrodes 13 and the connecting terminals 2a of the wire pattern 2. Moreover, the wire patterns 2 are not required to be provided away from the alignment marks 1, so that freedom in wiring can be improved and the outer size of the semiconductor apparatus 20 can be reduced. Moreover, particularly in this case, the alignment marks 1, for alignment of the protruding electrode 13 of the semiconductor element 12 and the wire pattern 2 of the tape carrier 10 upon connecting them, are provided within the aperture portion 4 that exposes (bares) the installation region of the semiconductor element 12 and that is formed in the solder resist 3 and that is covered wholly with the insulating resin 11, which is applied to both inside and periphery of the aperture portion 4, and via which detection of the alignment mark 1 is carried out. This reduces the outer size of the semiconductor apparatus, and allows good connection position accuracy between the protruding electrode 13 and the wire pattern 2, and prevents the exposure of the wire pattern 2 within the aperture portion 4 of the solder resist 3.

Note that the application region of the insulating resin 11 in a final product semiconductor apparatus (product) can be judged based on the application remains of the insulating resin 11 or a surface analysis.

The present embodiment mainly explains a structure in which the alignment mark 1 having a cross shape (when viewed from above) is provided, away from the wire patterns 2, in each corner (end) of the rectangular shape (when viewed from above) of the aperture portion 4 of the solder resist 3, the aperture portion 4 being formed within the connection overlap region and its peripheral region (installation region) in the tape carrier 10 used in the wire substrate 16. However, the shape and the layout (number) of the alignment mark 1 are not limited to this, and can be varied as long as good connection position accuracy is obtained.

FIG. 6 through FIG. 11 illustrate modified examples of the semiconductor apparatus according to the present embodiment, and illustrates structures in each of which the shape and the layout (number) of the alignment marks 1 are different from those in the semiconductor apparatus shown in FIG. 3. Also in FIG. 6 through FIG. 11, for ease of explanation, a semiconductor element is indicated by a chain double-dashed line, and an installation region (formation region) of the insulating resin is indicated by a broken line surrounding the chain double-dashed line.

Figure 6:
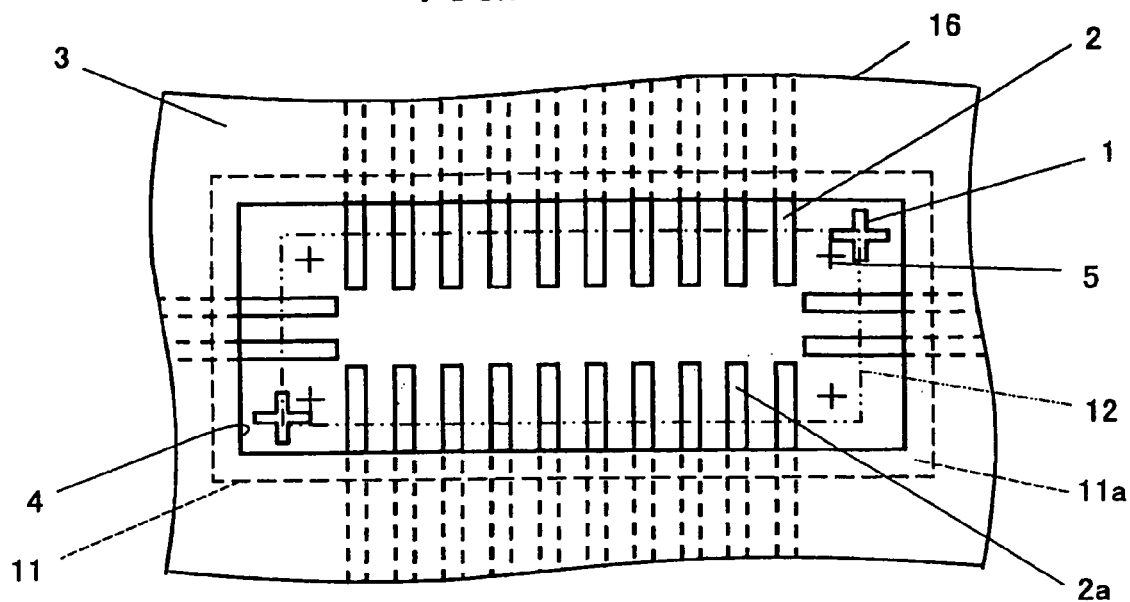
FIG. 6 is a cross sectional view schematically illustrating a major part of a structure of another semiconductor apparatus according to the embodiment.
Figure 7:
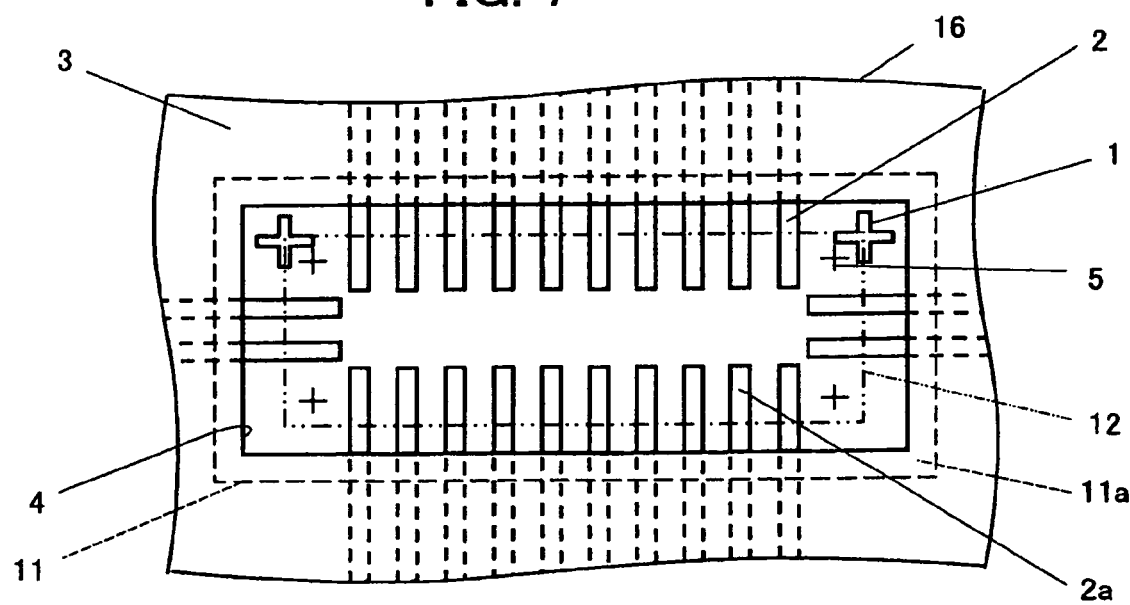
FIG. 7 is a cross sectional view schematically illustrating a major part of a structure of still another semiconductor apparatus according to the embodiment.

Each of FIG. 6 and FIG. 7 illustrates an example in which the aforementioned alignment marks 1 shown in FIG. 3 are provided in two of the four corners inside the rectangular shape of the aperture portion 4.

The present inventors found that two or more alignment marks 1, whose surface is wholly covered with the insulating resin 11 as described in the present embodiment, allow acquirement of an acceptable connection position accuracy slightly less than the alignment (positioning) accuracy in the semiconductor apparatus 20 shown in FIG. 3, during the alignment (automatic correction) carried out by detecting the alignment marks 1. Further, such a change (see FIG. 6 and FIG. 7) in layout (number) of the alignment marks 1 allows further reduction of the size of the tape carrier 10.

Figure 8:
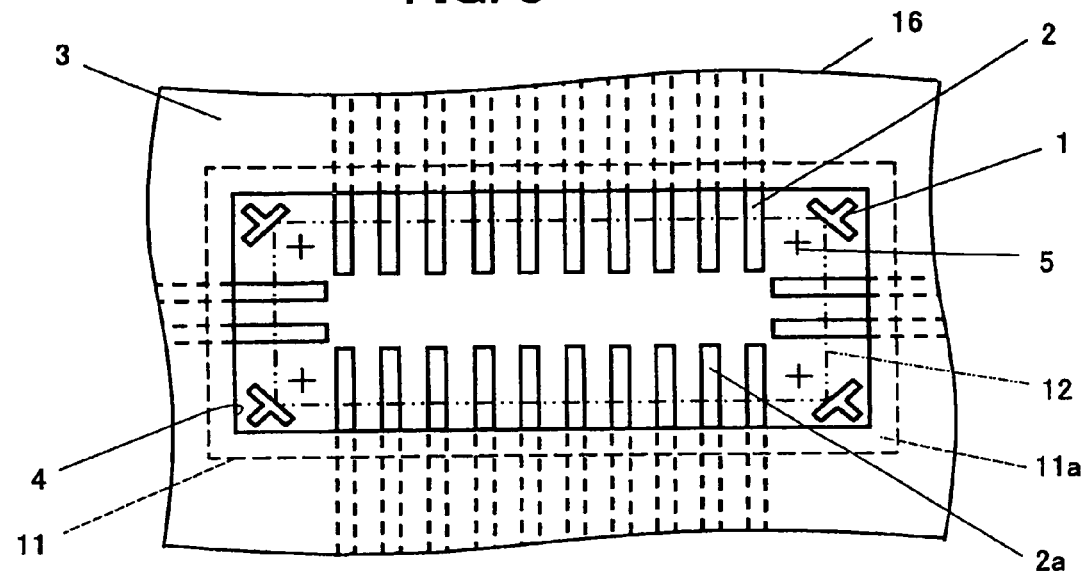
FIG. 8 is a cross sectional view schematically illustrating a major part of a structure of yet another semiconductor apparatus according to the embodiment.
Figure 9:
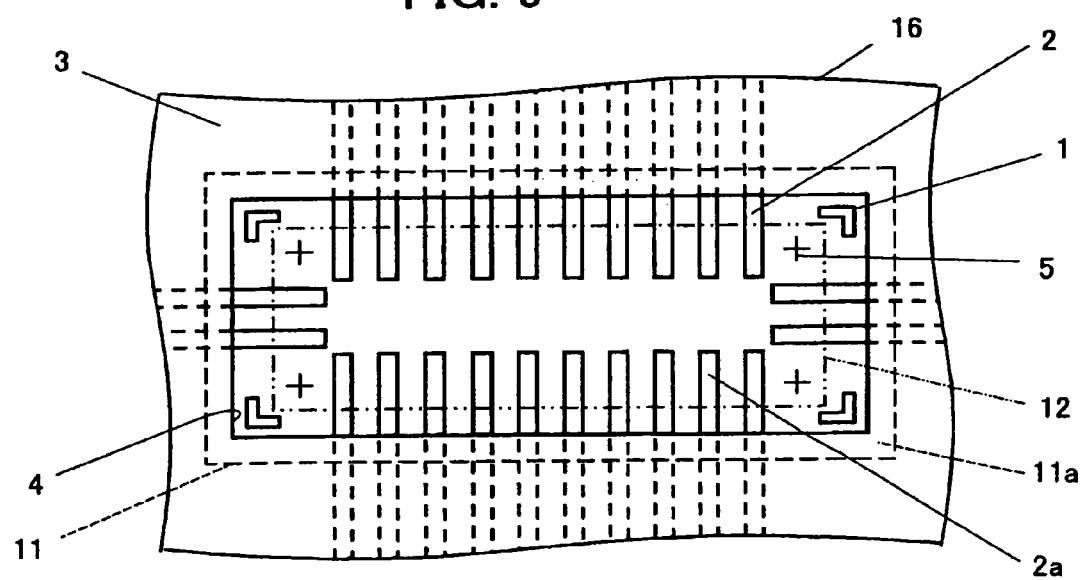
FIG. 9 is a cross sectional view schematically illustrating a major part of a structure of still another semiconductor apparatus according to the embodiment.

Meanwhile, FIG. 8 and FIG. 9 illustrate examples where alignment marks 1 are smaller than those in FIG. 3. Specifically, each alignment mark 1 in a semiconductor apparatus shown in each of FIG. 8 and FIG. 9 has such a shape that corresponds to a part of the shape of the alignment mark 1 shown in FIG. 3, and is provided within the aperture portion 4 having a rectangular shape.

More specifically, the alignment mark 1 of the semiconductor apparatus shown in FIG. 8 has a substantially T shape, and is provided in each corner (end) of the rectangular shape of the aperture portion 4 such that one side (longitudinal side) of the T shape abuts onto the corresponding corner of the semiconductor element when viewed from above.

On the other hand, the alignment mark 1 of the semiconductor apparatus shown in FIG. 9 has an L-shape, and is provided in each corner (end) of the rectangular shape of the aperture portion 4 such that the corners of the semiconductor element 12 are surrounded by the L-shaped alignment marks 1.

Such an alignment mark 1 shown in each of FIG. 8 and FIG. 9 is suitable for a case where a space is narrow between, e.g., an edge of the semiconductor element 12 and an edge of the aperture portion 4.

Figure 10:
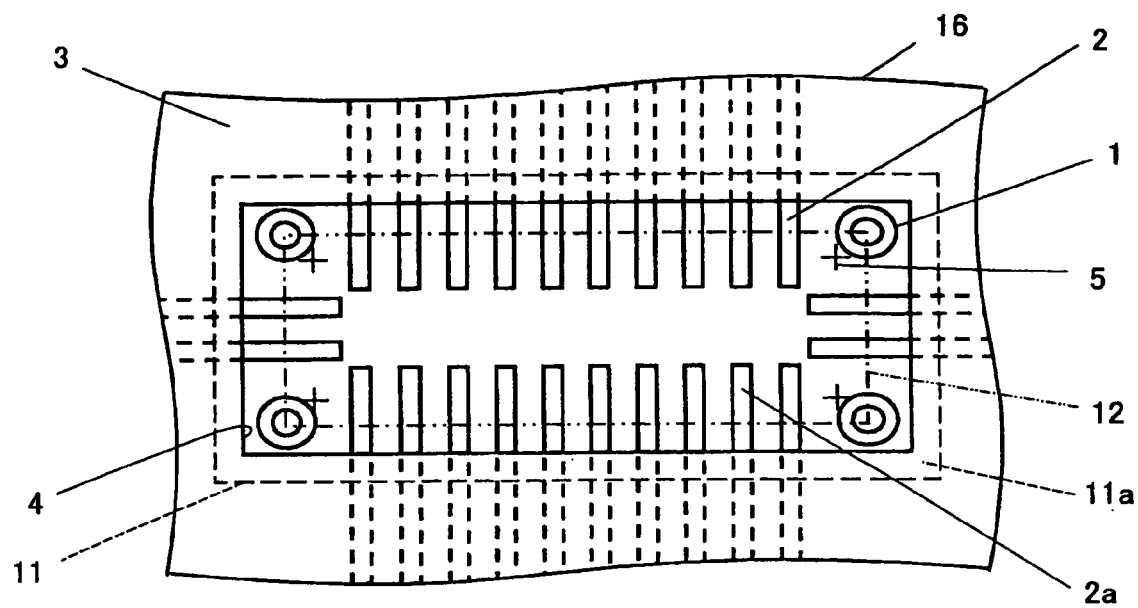
FIG. 10 is a cross sectional view schematically illustrating a major part of a structure of yet another semiconductor apparatus according to the embodiment.
Figure 11:
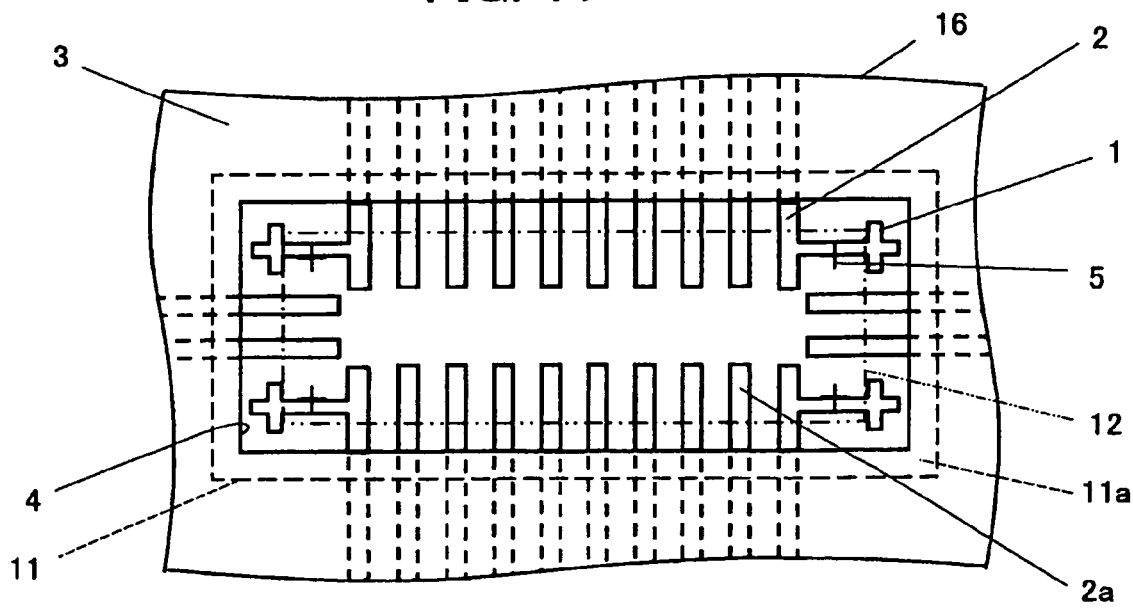
FIG. 11 is a cross sectional view schematically illustrating a major part of a structure of still another semiconductor apparatus according to the embodiment.

Alternatively, the alignment mark 1 can have various kinds of shape such as a donut-like (ring) or circular shape as shown in FIG. 10. Further, as shown in FIG. 11, the alignment mark 1 may be formed by extending the wire pattern 2, in a direction of the corner of the semiconductor element 12, to a location where the alignment mark 1 does not make contact with the protruding electrode 13.

As described above, according to the present embodiment, the effect of the present invention can be obtained even when the shape and the layout of the alignment marks 1 are changed, e.g., as shown in FIG. 6 through FIG. 11.

Note that the present embodiment exemplifies and explains the case where the alignment marks 1 and the wire patterns 2 are made of the same material, and are simultaneously manufactured by the same steps; however, the present invention is not limited to this. The alignment marks 1 and the wire patterns 2 may be made of different materials, and may be manufactured by different steps.

Further, in the present embodiment, the alignment marks 1 are made of a conductive material as the wire patterns 2 are, and are so provided as not to make contact with the semiconductor element 12. However, the alignment marks 1 may be made of any material that can be detected via the insulating resin 11. When the alignment mark 1 is made of a non-conductive material, the alignment mark 1 may make contact with the semiconductor element 12.

Further, the present embodiment explains the liquid crystal module as an example of the semiconductor module apparatus according to the present invention; however, the present invention is not limited to this and is applicable to various modules (module semiconductor apparatuses) such as a mobile phone, a mobile information terminal, a thin display, and a laptop computer. Moreover, the semiconductor apparatus according to the present invention, e.g., the semiconductor apparatus 20 can be suitably used for a driving apparatus of the above semiconductor modules.

Further, the present embodiment exemplifies and explains the semiconductor apparatus 20 in which a single semiconductor element 12 is provided on the tape carrier 10; however, the present invention is not limited to this. A plurality of the semiconductor elements 12 may be provided on a single tape carrier 10, e.g., along the output terminal 7 by using the COF method. In the present invention, the number of the semiconductor element 12 provided in a semiconductor apparatus is not limited.

Embodiment 2

Figure 12:
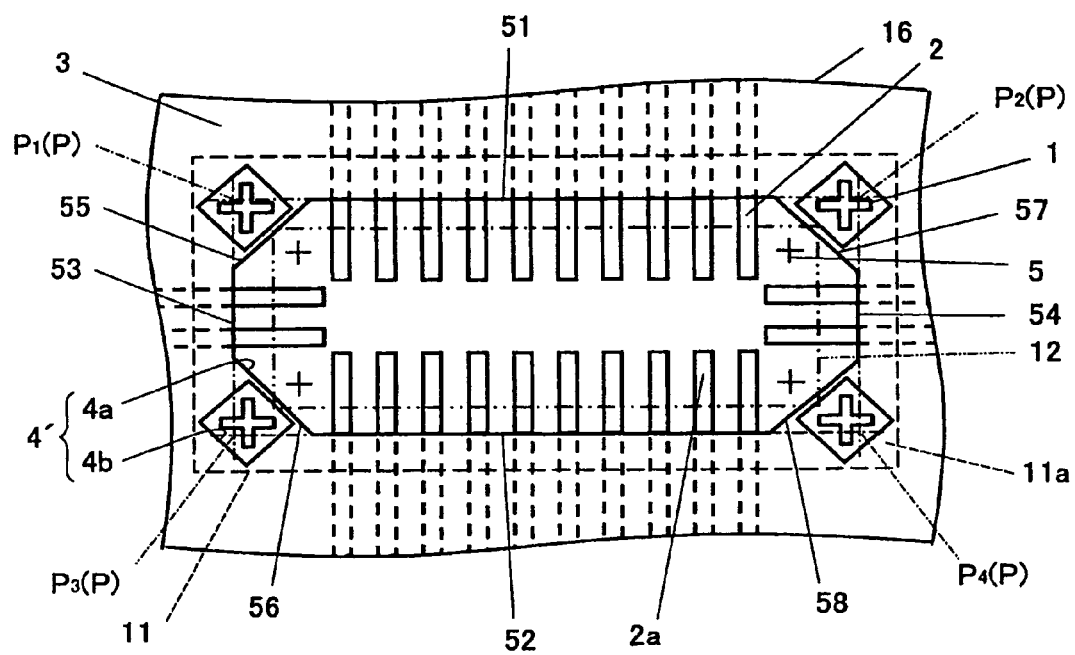
FIG. 12 is a cross sectional view schematically illustrating a major part of a structure of a semiconductor apparatus according to another embodiment.
Figure 13:
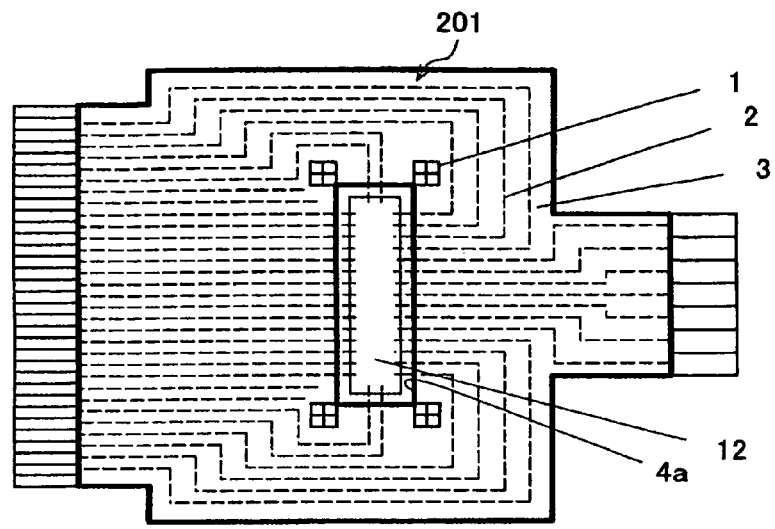
FIG. 13 is a plan view schematically illustrating a structure of a semiconductor apparatus in which an alignment mark is provided outside an aperture portion of a solder resist.

The following description will explain another embodiment of the present invention with reference to FIG. 12. Note that, for ease of explanation, components having the equivalent functions as those in Embodiment 1 will be given the same reference symbols, and explanation thereof will be omitted. The present embodiment mainly discusses differences from Embodiment 1.

Embodiment 1 above explains the case where the alignment marks 1 are provided within the rectangular shape of the aperture portion 4 of the solder resist 3, the aperture portion 4 being so formed as to surround the connection-overlap region on the tape carrier 10 (wire substrate 16). On the other hand, the present embodiment exemplifies and explains a case where the alignment marks 1 are provided outside an aperture portion 4a (solder resist aperture portion) of a solder resist 3, the aperture portion 4a being so provided as to surround a connection-overlap region of the semiconductor element 12 in a tape carrier 10 (a wire substrate 16).

In a semiconductor apparatus according to the present embodiment, each of the alignment marks 1 has a cross shape ("+" shape) having line segments parallel to respective edges (sides) of the semiconductor element 12 installed on the wire substrate 16. The alignment mark 1 is provided in the vicinity of each corner of the overlap region of the semiconductor element 12, more specifically, is so provided as to surround each corner of the semiconductor element 12 installed on the wire substrate 16. Moreover, four aperture portions 4b, each of which contains the alignment mark 1 within, are so provided as to surround the connection-overlap region of the semiconductor element 12. The aperture portion 4a exposes (bares) the connection-overlap region, and has an (substantially) octagon shape so as not to overlap with the aperture portions 4b.

With this, the semiconductor apparatus according to the present embodiment has an aperture portion 4' as an aperture portion of the solder resist 3. The aperture portion 4' is made up of the aperture portion 4a and the aperture portions 4b. The aperture portion 4a surrounds and exposes (bare) the connection-overlap region of the semiconductor element 12 on the tape carrier 10, and has an (substantially) octagon shape whose two sides are longer than the other sides when viewed from above. Each of the aperture portions 4b corresponds to a formation region of the alignment mark 1 provided along each oblique side (when viewed from above) of the aperture portion 4a.

More specifically, when viewed from above, the aperture portion 4a has such a shape obtained by removing the four corners (ends) of the (substantially) rectangular aperture portion 4 of the solder resist 3 in Embodiment 1 (such a structure that the solder resist is filled in four corners of a rectangular solder resist aperture portion which is larger in size than the semiconductor element 12). The aperture portion 4a is defined (constituted) by two types of edges (sides): (1) edges (sides) that are orthogonal to the respective wire patterns 2 formed within the installation region of the semiconductor element 12 in the tape carrier 10; and (2) edges (sides) that connect the edges (1) with each other and that are formed by sealing, with the solder resist 3, regions having no wire patterns 2 in the installation region of the semiconductor element 12.

In other words, the aperture portion 4a is defined by eight edges (sides) adjacent to the semiconductor element 12 installed (mounted) on the wire substrate 16. The eight line segments are made up of: (i) two line segments 51 and 52 (long length sides) that extend along long length sides of the semiconductor element 12, and that oppose each other, and that has the same length; (ii) two line segments 53 and 54 (short length sides) that extend along short length sides of the semiconductor element 12, and that oppose each other, and that has the same length; and (iii) four line segments 55, 56, 57, and 58 (short length sides; linkage attaining line segments) that connect the line segments 51 and 52 (long length sides) with the line segments 53 and 54 (short length sides) together, and that respectively oppose the corners of the semiconductor elements 12.

As described above, the semiconductor apparatus according to the present embodiment is a semiconductor apparatus in which the alignment mark 1 is provided outside the aperture portion 4a of the solder resist 3 when the aperture portion 4a is small, more specifically, in which the alignment mark 1 is provided outside the aperture portion 4a whose aperture size at the corners are smaller than that of the aperture portion 4 having the rectangular shape, the aperture portion 4a exposing the installation region of the semiconductor element 12.

In the present embodiment, this reduces the application region of the insulating resin 11 as compared with the case where the alignment mark 1 is covered with the insulating resin 11. Therefore, in the present embodiment, the insulating resin 11 can be applied to an entire upper face of the alignment mark 1 without an increase in size of the application region of the insulating resin 11 as compared with Embodiment 1.

Specifically, also in the present embodiment, the alignment mark 1 is provided within the normal application region of the insulating resin 11, and the insulating resin 11 is also applied to the entire upper face of the alignment mark 1 upon the application of the insulating resin 11. Via the insulating resin 11 thus applied, detection of the alignment mark 1 is carried out.

As such, the present embodiment allows reduction of an outer size of the semiconductor apparatus, and allows good connection position accuracy between the protruding electrodes 13 and the wire patterns 2, and allows prevention of exposure of the wire patterns 2 within the aperture portion 4 of the solder resist 3.

The present embodiment assumes that the alignment marks 1 are provided outside the aperture portion 4a such that each alignment mark 1 opposes each of the oblique sides (line segments 55 through 58) forming corners of the (substantially) octagon-shaped aperture portion 4a. The octagon shape is defined by (i) the two sides (the line segments 51 and 52), each of which intersects with the wire patterns 2 and extends along the long length sides of the semiconductor element 12 when viewed from above (i.e., extends along the installation site region of the wire patterns 2 in a direction of the long length sides of the semiconductor element 12); and (ii) the other sides (the line segments 53 through 58) shorter than the above two sides. However, the present invention is not limited to this structure, and the alignment mark 1 may be provided outside the corners of the aperture portion 4a having an elliptic shape or a polygon shape defined by (i) the above two sides, i.e., the line segments 51 and 52 (edges), and (ii) other sides (edges) shorter than the line segments 51 and 52.

In other words, in the present embodiment, the alignment marks 1 may be provided within the formation region of the fillet portion 11a made of the insulting resin 11 and formed outside the aperture portion 4a in the installation region of the semiconductor element 12. The alignment mark 1 is so provided as to oppose each of the line segments 55 through 58 (edges; linkage attaining line segments) of the aperture portion 4a. The line segments 55 through 58 connect the line segments 51 through 54 (edges) with each other by connecting adjacent line segments of the line segments 51 through 54 in such a manner that the line segments 55 through 58 respectively extend in inner sides with respect to intersection points P ($P_1$, $P_2$, $P_3$, and $P_4$) at which respective extension lines of the adjacent line segments intersect with each other. The line segments 51 and 52 (edges) each extend along the installation site of the wire patterns 2 in the long length direction of the semiconductor element 2, and each intersect (e.g., orthogonally) with the wire patterns 2. The line segments 53 and 54 (borders) each extend along the provided region of the wire patterns 2 in the short length direction of the semiconductor element 2, and each intersect (e.g., orthogonally) with the wire patterns 2. Therefore, when viewed from above, the aperture portion 4a has the following shape (1) or more preferably (2): (1) a shape (e.g., the elliptic shape or the polygon shape) that is defined by the line segments 51 through 58 (specifically, such a shape that is defined by the line segments 51 through 54, and the line segments 55 through 58 (borders) which connect the line segments 51 through 54 together and whose total length are shorter than a total of length from (i) each end of the line segments 51 through 54 to (ii) each nearest intersection point of the extension lines of the line segments 51 through 54); or (2) a shape (e.g., the octagon) that is defined by the line segments 51 through 54 and the line segments 55 through 58 connecting the line segments 51 through 54 with each other in the shortest distance. As such, according to the present embodiment, it is possible to provide a semiconductor apparatus in which (i) a region covered with the insulating resin 11 is small and (ii) is small in outer size, as described above.

Note that Embodiments 1 and 2 exemplify and explain the cases where the alignment marks 1 are formed within the installation region of the semiconductor element 12; however, the present invention is not limited to this, and the alignment marks 1 may be formed in the vicinity of the installation region. Because the entire upper face of each alignment mark 1 is covered with the insulating resin 11, the present invention allows good connection position accuracy between the protruding electrode 13 of the semiconductor element 12 and the connecting terminal 2a of the wire pattern 2, and allows prevention of any hindrance in detecting the alignment mark 1. Therefore, the alignment marks 1 are not required to be formed, e.g., outside the aperture portion 4 or 4a of the solder resist 3, away from the solder resist 3 and the installation site region of the insulating resin 11 as distant as possible for fear of the hindrance of the detection of the alignment marks 1. Therefore, according to the present invention, while keeping the detection accuracy, the alignment mark 1 can be provided within or in the vicinity of the semiconductor element installation region on the tape carrier 10 (that is, the alignment mark 1 can be formed close to the semiconductor element installation region as much as possible). This reduces outer size of the semiconductor apparatus, and improves freedom in wiring because the wire pattern is not required to be provided away from the alignment mark 1.

As described above, in the semiconductor apparatus and the semiconductor module apparatus according to the present invention, the insulating substrate has the mark patterns for aligning the connecting terminal of the semiconductor element with the connecting terminal of the wire pattern. The entire upper face of each of the mark patterns is covered with the insulating resin, so that the detection of the mark patterns is free from any hindrance. This allows good connection position accuracy between the respective connecting terminals of the semiconductor element and the wire pattern. Moreover, with the above structure, the mark patterns are not required to be formed, e.g., outside the solder resist aperture portion, exposing the wire pattern, of the solder resist covering the wire pattern, and be formed away from the solder resist and the provided region of the insulating resin as distant as possible for fear of the hindrance of the detection of the mark pattern. Therefore, it is possible to provide the mark patterns within or in the vicinity of the semiconductor element installation region in the insulating substrate. Because the wire patterns are not required to be provided away from the mark patterns, outer size of the semiconductor apparatus is reduced, and freedom in wiring is improved. Therefore, according to the present invention, it is possible to provide a COF type semiconductor apparatus (i.e., a semiconductor apparatus having no device hole in the semiconductor element installation region) and a semiconductor module apparatus, each of which has a small outer size and good connection position accuracy between the respective connecting terminals of the semiconductor element and the wire pattern in the wire substrate.

Such a semiconductor apparatus can be suitably used as a driving apparatus of various kinds of semiconductor module apparatuses such as a mobile phone, a mobile information terminal, a thin display, and a laptop computer.

It is preferable that the mark patterns be provided within or in the vicinity of the semiconductor element installation region overlapping with the insulating resin in the insulating substrate. It is more preferable that the mark patterns be provided within the semiconductor element installation region overlapping with the insulating resin in the insulating substrate. A reason for this is for reducing the size of the semiconductor apparatus and for improving connection position accuracy between the respective connecting terminals of the semiconductor element and the wire pattern.

Note that, in the present invention, the semiconductor element installation region overlapping with the insulating resin indicates the aforementioned semiconductor element overlap region and the fillet formation region formed on the periphery of the semiconductor element overlap region by the insulating resin.

Specifically, the mark patterns are provided within, e.g., the solder resist aperture portion of the solder resist covering the wire pattern, or are provided in the fillet formation region made of the insulating resin and formed outside the solder resist aperture portion which exposes the connecting terminal of the wire pattern.

In this case, when the mark patterns are provided in the fillet formation region made of the insulating resin and formed outside the solder resist aperture portion, which exposes the wire pattern, of the solder resist covering the wire pattern, it is possible to reduce the outer size of the semiconductor apparatus, to keep good connection position accuracy between the respective connecting terminals of the semiconductor element and the wire pattern, and to prevent the exposure of the wire pattern in the solder resist aperture portion.

On the other hand, when the mark patterns are provided within the solder resist aperture portion, the insulating resin wholly covering the solder resist aperture portion prevents the exposure of the wire patterns in the solder resist aperture portion. Moreover, the structure above makes it possible to reduce the outer size of the semiconductor apparatus, to keep good connection position accuracy between the respective connecting terminals of the semiconductor element and the wire pattern, and to prevent the exposure of the wire patterns in the solder resist aperture portion.

Further, in order to cover the entire upper face of each of the mark patterns with the insulating resin in cases where the mark pattern is provided in the fillet formation region outside the solder resist aperture portion, it is preferable that: when viewed from above, the solder resist aperture portion have a shape defined by (i) line segments, each of which intersects with the wire patterns provided in the long length direction of the semiconductor element, and each of which extends along the installation site region of the wire patterns, (ii) line segments, each of which intersects with the wire patterns extending in the short length direction of the semiconductor element, and each of which extends along the installation site region of the wire patterns, and (iii) linkage attaining line segments, each of which connect ones of the line segments such that the linkage attaining line segment extends in an inner side with respect to each intersection point of respective extension lines of the line segments, and the mark patterns are formed outside the solder resist aperture portion and oppose the respective linkage attaining line segments.

Moreover, it is preferable that: when viewed from above, the solder resist aperture portion have a substantially octagon shape, two sides of the solder resist aperture portion intersecting with the wire patterns provided in the long length direction of the semiconductor element, the two sides extending along the installation site region of the wire patterns, and the two sides being longer than other sides, and the mark pattern be so provided as to oppose respective oblique sides of the solder resist aperture portion, the oblique sides opposing corners of the semiconductor element.

Even in the case where the mark patterns are formed outside the solder resist aperture portion, the formation of the solder resist aperture portion or the mark patterns as above makes it possible to form the mark patterns in the semiconductor element installation region overlapping with the insulating resin in the insulating substrate, and to provide a semiconductor apparatus having a small region covered with the insulating resin and a smaller outer size.

As described above, a method for manufacturing the semiconductor apparatus according to the present invention includes the steps of: (i) providing the insulating resin on the insulating substrate such that the insulating resin covers an entire surface of each of the mark patterns; and (ii) detecting the mark patterns via the insulating resin provided on the mark patterns, and aligning the connecting terminals of the semiconductor element with the connecting terminals of the wire patterns. This allows prevention of hindrance in detection of the mark patterns, and allows alignment, with good connection position accuracy, of the connecting terminals of the semiconductor element and the connecting terminal of the wire pattern. Further, with the method, the mark patterns are not required to be formed, e.g., outside the solder resist aperture portion that exposes the connecting terminals of the wire patterns, away from the solder resist as distant as possible for fear of the hindrance of the detection of the mark patterns. Therefore, with the method, the mark patterns can be provided within or in the vicinity of the semiconductor element installation region, overlapping with the insulating resin, on the insulating substrate. This reduces outer size of the semiconductor apparatus, and improves freedom in wiring because the wire patterns are not required to be provided away from the mark patterns. As such, according to the method, it is possible to provide a COF type semiconductor apparatus having a small outer size and having good connection position accuracy between the connecting terminals of the semiconductor element and the connecting terminals of the wire patterns of the wire substrate.

As described above, a wire substrate according to the present invention includes: the mark patterns, for use in alignment of (i) the connecting terminals of wire patterns and (ii) the connecting terminals of the semiconductor element to be installed in the insulating substrate, the mark patterns being provided within a solder resist aperture portion that exposes the connecting terminals of the wire patterns, the solder resist aperture portion being formed in a solder resist covering the wire patterns provided in the insulating substrate. Therefore, it is possible to easily obtain a wire substrate that has the mark patterns in the semiconductor element installation region overlapping with the insulating resin, which mark patterns each have the upper face entirely covered with the insulating resin and are used when installing the semiconductor element in the insulating substrate.

As described above, according to the present invention, the solder resist aperture portion has a shape, when viewed from above, defined by (i) line segments, each of which intersects with the wire patterns provided in a long length direction of the semiconductor element installed in the insulating substrate, and each of which extends along an installation site region of the wire patterns, (ii) line segments, each of which intersects with the wire patterns extending in a short length direction of the semiconductor element, and each of which extends along an installation site region of the wire patterns, and (iii) linkage attaining line segments, each of which connect adjacent ones of the line segments such that the linkage attaining line segment extends in an inner side with respect to each intersection point of respective extended lines of the line segments; and the mark pattern is formed outside the solder resist aperture portion and opposes each of the linkage attaining line segments. Moreover, the wire substrate includes: the mark patterns for alignment of (i) the connecting terminals of the wire patterns and (ii) the connecting terminals of the semiconductor element to be installed on the insulating substrate, the mark patterns opposing the linkage attaining line segments. With this, it is possible to easily obtain a wire substrate that has the mark patterns in the semiconductor element installation region overlapping with the insulating resin, which mark patterns each have the upper face entirely covered with the insulating resin and are used when installing the semiconductor element in the insulating substrate.

As described above, a method for manufacturing the semiconductor apparatus according to the present invention includes the steps of: (i) providing the insulating resin on the insulating substrate such that the insulating resin covers an entire surface of each of the mark patterns; and (ii) detecting the mark patterns via the insulating resin provided on the mark patterns, and aligning the connecting terminals of the semiconductor element and the connecting terminals of the wire patterns. This makes it possible to prevent hindrance of detection of the mark pattern, and to carry out alignment, with good connection position accuracy, of the connecting terminals of the semiconductor element and the connecting terminal of the wire pattern. Further, with the method, the mark patterns are not required to be formed, e.g., outside the solder resist aperture portion that exposes the connecting terminals of the wire patterns, and be formed away from the solder resist as distant as possible for fear of the hindrance of the detection of the mark pattern. Therefore, with the method, the mark patterns can be provided within or in the vicinity of the semiconductor element installation region, overlapping with the insulating resin, on the insulating substrate. This reduces outer size of the semiconductor apparatus, and improves freedom in wiring because the wire patterns are not required to be provided away from the mark patterns. As such, according to the method, it is possible to provide a COF type semiconductor apparatus having a small outer size and having good connection position accuracy between the connecting terminals of the semiconductor element and the connecting terminals of the wire patterns of the wire substrate.

As described above, a wire substrate according to the present invention includes: the mark patterns for use in alignment of (i) the connecting terminals of wire patterns and (ii) the connecting terminals of the semiconductor element to be installed in the insulating substrate, the mark patterns being provided within a solder resist aperture portion that exposes the connecting terminals of the wire patterns, the solder resist aperture portion being formed in a solder resist covering the wire patterns provided in the insulating substrate. Therefore, it is possible to easily obtain a wire substrate that has the mark patterns in the semiconductor element installation region overlapping with the insulating resin, which mark patterns each have the upper face entirely covered with the insulating resin and are used when installing the semiconductor element in the insulating substrate.

As described above, according to the present invention, the solder resist aperture portion having a shape, when viewed from above, defined by (i) line segments, each of which intersects with the wire patterns provided in a long length direction of the semiconductor element installed in the insulating substrate, and each of which extends along an installation site region of the wire patterns, (ii) line segments, each of which intersects with the wire patterns extending in a short length direction of the semiconductor element, and each of which extends along an installation site region of the wire patterns, and (iii) linkage attaining line segments, each of which connect adjacent line segments of the line segments such that the linkage attaining line segment extends in an inner side with respect to each intersection point of respective extended lines of the line segments; and the mark patterns are formed outside the solder resist aperture portion and oppose the respective linkage attaining line segments. Moreover, the wire substrate includes: the mark patterns for alignment of (i) the connecting terminals of the wire patterns and (ii) the connecting terminals of the semiconductor element to be installed in the insulating substrate, the mark patterns opposing the respective linkage attaining line segments. With this, it is possible to easily obtain a wire substrate that has the mark pattern in the semiconductor element installation region overlapping with the insulating resin, and which mark patterns each have the upper face entirely covered with the insulating resin and are used when installing the semiconductor element in the insulating substrate.

Therefore, with the structures above, it is possible to provide a wire substrate suitably used for a COF type semiconductor apparatus having a small outer size and having good connection position accuracy between the connecting terminals of the semiconductor element and the connecting terminals of the wire patterns of the wire substrate.

The present invention is not limited to the embodiments above, but may be altered within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A wire substrate, comprising:
an insulating substrate;
a plurality of wire patterns provided on the insulating substrate;
mark patterns provided away from the wire patterns; and
an insulating resin, wherein:
the mark patterns are patterns for alignment of connecting terminals of the wire patterns and connecting terminals of a semiconductor element when the connecting terminals of the wire patterns and the connecting terminals of the semiconductor element are electrically connected, the mark patterns being provided at positions where the mark patterns are located at least partially outside the semiconductor element in a plan view when the connecting terminals of the wire patterns are electrically connected to the connecting terminals of the semiconductor element; and
the insulating resin covers an entire upper face of each of the mark patterns and an entire upper face of each of the connecting terminals of the wire patterns.

2. The wire substrate as set forth in claim 1, wherein:
the insulating resin wholly covers a solder resist aperture portion that exposes the connecting terminals of the wire patterns, the solder resist aperture portion being provided in a solder resist covering the wire patterns.

3. The wire substrate as set forth in claim 1, wherein:
the mark patterns are provided in a semiconductor element installation region on the insulating substrate, the semiconductor element installation region overlapping with the insulating resin.

4. The wire substrate as set forth in claim 3, wherein:
the insulating resin wholly covers a solder resist aperture portion that exposes the connecting terminals of the wire patterns, the solder resist aperture portion being provided in a solder resist covering the wire patterns.

5. The wire substrate as set forth in claim 1, wherein:
the mark patterns are provided within a solder resist aperture portion that exposes the connecting terminals of the wire patterns, the solder resist aperture portion being provided in a solder resist covering the wire patterns.

6. The wire substrate as set forth in claim 5, wherein:
the insulating resin wholly covers the solder resist aperture portion that exposes the connecting terminals of the wire patterns, the solder resist aperture portion being provided in the solder resist covering the wire patterns.

7. The wire substrate as set forth in claim 1, wherein:
the mark patterns are provided in a formation region of a fillet formed, by the insulating resin, outside a solder resist aperture portion that exposes the connecting terminals of the wire patterns, the solder resist aperture portion being provided in a solder resist covering the wire patterns.

8. The wire substrate as set forth in claim 7, wherein:
when viewed from above, the solder resist aperture portion has a shape defined by (i) line segments, each of which intersects with the wire patterns provided in a long length direction of the semiconductor element, and each of which extends along an installation site region of the wire patterns, (ii) line segments, each of which intersects with the wire patterns extending in a short length direction of the semiconductor element, and each of which extends along the installation site region of the wire patterns, and (iii) linkage attaining line segments, each of which connects adjacent ones of the line segments such that the linkage attaining line segment extends in an inner side with respect to each intersection point of respective extension lines of the line segments,
the mark patterns are formed outside the solder resist aperture portion and oppose the respective linkage attaining line segments.

9. The wire substrate as set forth in claim 7, wherein:
when viewed from above, the solder resist aperture portion has a substantially octagon shape, two sides of the solder resist aperture portion intersecting with the wire patterns provided in a long length direction of the semiconductor element, the two sides extending along an installation site region of the wire patterns, and the two sides being longer than other sides, and
the mark patterns are so provided as to oppose respective oblique sides of the solder resist aperture portion, the oblique sides opposing corners of the semiconductor element.

10. A semiconductor device, comprising the wire substrate as set forth in claim 1.

11. A semiconductor module, comprising the wire substrate as set forth in claim 1.

12. A wire substrate comprising:
an insulating substrate;
a plurality of wire patterns provided on the insulating substrate;
mark patterns provided away from the wire patterns; and
an insulating resin, wherein:
the mark patterns are patterns for alignment of connecting terminals of the wire patterns and connecting terminals of a semiconductor element when the connecting terminals of the wire patterns and the connecting terminals of the semiconductor element are electrically connected, the mark patterns being provided at positions where the mark patterns are located at least partially outside the semiconductor element in a plan view when the connecting terminals of the wire patterns are electrically connected to the connecting terminals of the semiconductor element; and the mark patterns being provided within a solder resist aperture portion that exposes the connecting terminals of the wire patterns, the solder resist aperture portion being formed in a solder resist covering the wire patterns provided on the insulating substrate, and the insulating resin covers an entire upper face of each of the mark patterns and an entire upper face of each of the connecting terminals of the wire patterns.

13. A semiconductor device, comprising the wire substrate as set forth in claim 12.

14. A semiconductor module, comprising the wire substrate as set forth in claim 12.

15. A wire substrate comprising:
an insulating substrate;

a plurality of wire patterns provided on the insulating substrate;

mark patterns provided away from the wire patterns; and an insulating resin, wherein:

the mark patterns are patterns for alignment of connecting terminals of the wire patterns and connecting terminals of a semiconductor element when the connecting terminals of the wire patterns and the connecting terminals of the semiconductor element are electrically connected, the mark patterns being provided at positions where the mark patterns are located at least partially outside the semiconductor element in a plan view when the connecting terminals of the wire patterns are electrically connected to the connecting terminals of the semiconductor element; and the mark patterns being provided outside a solder resist aperture portion such that the mark patterns oppose respective linkage attaining line segments, and the insulating resin covers an entire upper face of the mark patterns and an entire upper face of each of the connecting terminals of the wire patterns, the solder resist aperture portion of the solder resist covering the wire patterns provided in the insulating substrate, the solder resist aperture portion including a shape, when viewed from above, defined by line segments, each of which intersects with the wire patterns provided in a long length direction of the semiconductor element installed on the insulating substrate, and each of which extends along an installation site region of the wire patterns, by line segments, each of which intersects with the wire patterns extending in a short length direction of the semiconductor element, and each of which extends along an installation site region of the wire patterns, and by the linkage attaining line segments, each of which connect adjacent line segments of the line segments such that the linkage attaining line segment extends in an inner side with respect to each intersection point of respective extended lines of the line segments and the mark pattern being formed outside the solder resist aperture portion and opposing the respective linkage attaining line segments.

16. A semiconductor device, comprising the wire substrate as set forth in claim 15.

17. A semiconductor module, comprising the wire substrate as set forth in claim 15.

* * * * *